(12) United States Patent
Ohtani et al.

(10) Patent No.: US 6,914,302 B2
(45) Date of Patent: Jul. 5, 2005

(54) SEMICONDUCTOR DEVICE AND MANUFACTURING METHOD THEREOF

(75) Inventors: Hisashi Ohtani, Kanagawa (JP); Shunpei Yamazaki, Tokyo (JP); Jun Koyama, Kanagawa (JP); Yasuyuki Arai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/837,552

(22) Filed: Apr. 19, 2001

(65) Prior Publication Data

US 2002/0175376 A1 Nov. 28, 2002

(51) Int. Cl.⁷ .............................................. H01L 21/786
(52) U.S. Cl. ...................... 257/350; 257/347; 257/365; 257/366; 257/72
(58) Field of Search ................................ 257/347, 350, 257/352, 365, 366, 369, 59, 69, 72, 715, 712

(56) References Cited

U.S. PATENT DOCUMENTS

| | | |
|---|---|---|
| 4,609,930 A | 9/1986 | Yamazaki et al. |
| 4,748,485 A | 5/1988 | Vasudev |
| 4,977,105 A | 12/1990 | Okamoto et al. |
| 4,984,033 A | 1/1991 | Ishizu et al. |
| 4,996,575 A | 2/1991 | Ipri et al. |
| 5,034,788 A | 7/1991 | Kerr |
| 5,103,277 A | 4/1992 | Caviglia et al. |
| 5,124,769 A | 6/1992 | Tanaka et al. |
| 5,140,391 A | 8/1992 | Hayashi et al. |
| 5,185,535 A | 2/1993 | Farb et al. |
| 5,198,379 A | 3/1993 | Adan |
| 5,233,211 A | 8/1993 | Hayashi et al. |
| 5,246,882 A | 9/1993 | Hartmann |
| 5,273,921 A | 12/1993 | Neudeck et al. |
| 5,275,972 A | 1/1994 | Ogawa et al. |

(Continued)

FOREIGN PATENT DOCUMENTS

| | | |
|---|---|---|
| EP | 0 178 447 | 4/1986 |
| JP | 57-032641 | 2/1982 |
| JP | 58-115850 | 7/1983 |
| JP | 60-081869 | 5/1985 |
| JP | 60-154660 | 8/1985 |
| JP | 61-067269 | 4/1986 |
| JP | 61-088565 | 5/1986 |
| JP | 61-220371 | 9/1986 |
| JP | 62-005661 | 1/1987 |
| JP | 62-117359 | 5/1987 |

(Continued)

OTHER PUBLICATIONS

Byeon, Sang Gi et al. *"High–Performance Tantalum Oxide Capacitors Fabricated by a Novel Reoxidation Scheme"* IEEE Transactions On Electron Devices, vol. 37, No. 4, Apr. 1990.

(Continued)

*Primary Examiner*—George Eckert
*Assistant Examiner*—N. Drew Richards
(74) *Attorney, Agent, or Firm*—Nixon Peabody LLP; Jeffrey L. Costellia

(57) ABSTRACT

In a CMOS circuit formed on a substrate 101, a subordinate gate wiring line (a first wiring line) 102a and main gate wiring line (a second wiring line) 107a are provided in an n-channel TFT. The LDD regions 113 overlaps the first wiring line 102a and does not overlap the second wiring line 107a. Thus, when a gate voltage is applied to the first wiring line, the GOLD structure is formed, while no applying forms the LLD structure. In this way, the GOLD structure and the LLD structure can be used appropriately in accordance with the respective specifications required for the circuits.

35 Claims, 13 Drawing Sheets

U.S. PATENT DOCUMENTS

| | | | |
|---|---|---|---|
| 5,281,840 A | | 1/1994 | Sarma |
| 5,294,821 A | | 3/1994 | Iwamatsu |
| 5,315,132 A | | 5/1994 | Yamazaki |
| 5,327,001 A | | 7/1994 | Wakai et al. |
| 5,359,219 A | | 10/1994 | Hwang |
| 5,371,398 A | | 12/1994 | Nishihara |
| 5,420,048 A | | 5/1995 | Kondo |
| 5,463,483 A | | 10/1995 | Yamazaki |
| 5,470,793 A | | 11/1995 | Kalnitsky |
| 5,475,238 A | | 12/1995 | Hamada |
| 5,485,019 A | | 1/1996 | Yamazaki et al. |
| 5,506,436 A | | 4/1996 | Hayashi et al. |
| 5,521,107 A | | 5/1996 | Yamazaki et al. |
| 5,532,850 A | | 7/1996 | Someya et al. |
| 5,580,802 A | | 12/1996 | Mayer et al. |
| 5,604,368 A | | 2/1997 | Taur et al. |
| 5,621,224 A | | 4/1997 | Yamazaki et al. |
| 5,646,424 A | | 7/1997 | Zhang et al. |
| 5,702,963 A | * | 12/1997 | Vu et al. ............... 437/41 |
| 5,807,772 A | | 9/1998 | Takemura |
| 5,818,076 A | | 10/1998 | Zhang et al. |
| 5,917,221 A | | 6/1999 | Takemura |
| 6,054,734 A | | 4/2000 | Aozasa et al. |
| 6,225,150 B1 | * | 5/2001 | Lee et al. ............... 438/153 |
| 6,252,248 B1 | | 6/2001 | Sano et al. |
| 6,323,068 B1 | | 11/2001 | Seo |
| 6,330,044 B1 | * | 12/2001 | Murade ............... 349/44 |
| 6,479,333 B1 | | 11/2002 | Takano et al. |
| 6,603,453 B2 | | 8/2003 | Yamazaki et al. |
| 2001/0030722 A1 | | 10/2001 | Murade |
| 2002/0080295 A1 | | 6/2002 | Someya et al. |
| 2002/0093019 A1 | | 7/2002 | Hirabayashi et al. |
| 2003/0038303 A1 | | 2/2003 | Hashimoto et al. |

FOREIGN PATENT DOCUMENTS

| | | |
|---|---|---|
| JP | 64-019761 | 1/1989 |
| JP | 01-059866 | 3/1989 |
| JP | 64-053459 | 3/1989 |
| JP | 64-053460 | 3/1989 |
| JP | 64-059866 | 3/1989 |
| JP | 02-015676 | 1/1990 |
| JP | 03-082171 | 4/1991 |
| JP | 03-256365 | 11/1991 |
| JP | 04-152574 | 5/1992 |
| JP | 04-364074 | 12/1992 |
| JP | 02-666293 | 6/1997 |
| JP | 11-354802 | 12/1999 |
| JP | 2000-183356 | 6/2000 |
| JP | 2000-194014 | 7/2000 |
| JP | 2000-196093 | 7/2000 |
| WO | 93/21659 | 10/1993 |

OTHER PUBLICATIONS

Farrah et al., "Analysis of Double–Gate Thin–Film Transistor", pp. 69–74, Feb. 1967, IEEE Transactions on Electron Devices, vol. ED–14, No. 2.

Ishii et al., "A Trial Product of Dual–Gate MOS (X MOS) Device", pp. 405, 1985, 46th Japan Society of Applied Physics, 2a–V–9.

Ishii et al., "Experimental Fabrication of XMOS Transistors Using Lateral Solid–Phase Epitaxy of CVD Silicon Films", pp. L521–L523, Apr. 1990, Japanese Journal of Applied Physics, vol. 29, No. 4.

Noguchi et al., "Advanced High Mobility Polysilicon Super–thin Film Transistor (SFT) Using Solid Phase Growth", pp. 549–552, 1986, Extended Abstracts of the 18th International Conference on Solid State Devices and Materials, Tokyo, B–10–2.

Hayashi et al., "Polysilicon Super–Thin–Film Transistor (SFT)", pp. L819–L820, Nov. 1984, Japanese Journal of Applied Physics, vol. 23, No. 11.

Hayashi et al., "High Performance Superthin Film Transistor (SFT) with Twin Gates", pp. 59–62, 1987, Extended Abstracts of the 19th Conference on Solid State Devices and Materials, Tokyo, A–3–5.

Sekigawa et al., "The Development of XMOS Transistor", pp. 44–49, 1986, Semiconductor World.

Tuan et al., "Dual–Gate as–Si:H Thin Film Transistors", pp. 357–359, Dec. 1982, IEEE Electron Device Letters, Vol. EDL–3, No. 12.

Specifications and Drawings for Patent Application Ser. No. 09/837,877, "Semiconductor Device", Filing Date: Apr. 19, 2001, Shunpei Yamazaki et al.

Specifications and Drawings for Patent Applicaton Ser. No. 09/837,558, "Semiconductor Device and Manufacturing Method Thereof", Filing Date: Apr. 19, 2001, Shunpei Yamazaki et al.

* cited by examiner phosphorus doping step boron doping step backside exposure    phosphorus doping step pixel TFT portion     storage capacitor portion pixel TFT portion     storage capacitor portion

NTFT   PTFT pixel TFT portion   storage capacitor portion

NTFT  PTFT pixel TFT portion   storage capacitor portion gettering step by phosphorus boron doping step back side exposure step    phosphorus doping step

SEMICONDUCTOR DEVICE AND MANUFACTURING METHOD THEREOF

BACKGROUND OF THE INVENTION

1. Field of the Invention

The present invention relates to a semiconductor device having a circuit composed of a thin film transistor (hereinafter referred to as TFT). For example, the invention relates to an electro-optical device represented by a liquid crystal display panel and to electronic equipment mounted with the electro-optical device as a component.

In this specification, a 'semiconductor device' refers to a device in general that utilizes semiconductor characteristics to function, and electro-optical devices, semiconductor circuits, and electronic equipment are semiconductor devices.

2. Description of Related Art

A thin film transistor (hereinafter referred to as TFT) can be formed on a transparent glass substrate, and hence its application to an active matrix liquid crystal display (hereinafter referred to as AM-LCD) has been developed actively. A TFT utilizing a crystalline semiconductor film (typically, a polysilicon film) can provide high mobility, making it possible to integrate functional circuits on the same substrate for high definition image display.

An active matrix liquid crystal display device requires million TFTs for pixels alone when the screen is to have high definition. Its functional circuits also need TFTs to further increase the number of required TFTs. Each of these TFTs has to have secured reliability and operate stably in order to realize stable operation of the liquid crystal display device.

However, the TFT is considered as not so equal in terms of reliability to a MOSFET that is formed on a single crystal semiconductor substrate. The TFT experiences lowering of mobility and ON current when it is operated for a long period of time, as the MOSFET suffers from the same phenomena. One of causes of the phenomena is characteristic degradation due to hot carriers that accompany enlargement of a channel electric field.

The MOSFET, on the other hand, has the LDD (lightly doped drain) structure as a well-known reliability improving technique. This structure adds a low concentration impurity region inside a source drain region. The low concentration impurity region is called an LDD region. Some TFTs employ the LDD structure.

Another known structure for the MOSFET is to make the LDD region somewhat overlap a gate electrode with a gate insulating film sandwiched therebetween. This structure can be obtained in several different modes. For example, structures called GOLD (Gate-drain overlapped LDD) and LATID (Large-tilt-angle implanted drain) are known. The hot carrier withstandingness can be enhanced by these structures There have been attempts to apply these structures for MOSFETs to TFTs. However, application of the GOLD structure (in this specification, a structure having an LDD region to which a gate voltage is applied is called a GOLD structure whereas a structure having merely an LDD region to which a gate voltage is not applied is called an LDD structure) to a TFT has a problem of OFF current (current flowing when the TFT is in an OFF state) being larger than in the LDD structure. For that reason, the GOLD structure is not suitable for a circuit in which OFF current should be as small as possible, such as a pixel matrix circuit of an AM-LCD.

SUMMARY OF THE INVENTION

An object of the present invention is to provide an AM-LCD having high reliability by constructing circuits of the AM-LCD from TFTs having different structures to suit the respective functions of the circuits. The invention aims to accordingly enhance the reliability of a semiconductor device (electronic equipment) having this AM-LCD.

According to a structure of the present invention disclosed in this specification, a semiconductor device including a CMOS circuit formed by n-channel TFT and p-channel TFT, characterized in that:

the CMOS circuit has a structure that an active layer is sandwiched by a first wiring line and a second wiring line through an insulating layer in only the n-channel TFT, the active layer includes a low concentration impurity region that is in contact with the channel formation region; and the low concentration impurity region is formed to overlap the first wiring line and not to overlap the second wiring line.

In the above structures, the first wiring line is electrically connected with the second wiring line. That is, a first wiring line and a second wiring line are in the same electric potential, so that it becomes possible to add the same voltage to active layers.

According to another structure of the present invention, a semiconductor device including a CMOS circuit formed by n-channel TFT and p-channel TFT, characterized in that:

the CMOS circuit has a structure that an active layer is sandwiched by a first wiring line and a second wiring line through an insulating layer in only the n-channel TFT; and the second wiring line has a portion of structure laminated with a first conductive layer and a second conductive layer, and a portion of structure wrapped a third conductive layer with the first conductive layer and the second conductive layer.

In the above structures, the third conductive layer is used material with a lower resistance value than the first conductive layer or the second conductive layer. Concretely, the first conductive layer or the second conductive layer is preferably a conductive film mainly containing an element selected from the group consisting of tantalum (Ta), titanium (Ti), tungsten (W), molybdenum (Mo), and silicon (Si), or an alloy film or silicide film containing the above elements in combination. And the third wiring line is preferably a conductive film mainly containing aluminum (Al) or copper (Cu).

According to another structure of the present invention, a semiconductor device having a pixel matrix circuit that includes a pixel TFT and a storage capacitor formed in n-channel TFT, characterized in that:

the pixel TFT has a structure that an active layer is sandwiched by a first wiring line and a second wiring line through an insulating layer, the active layer includes a low concentration impurity region that is in contact with the channel formation region; and the low concentration impurity region is formed to overlap the first wiring line and not to overlap the second wiring line.

In the above structures, the first wiring line is kept at the ground electric potential or at the source power supply electric potential, and is kept at the floating electric potential.

According to another structure of the present invention, a semiconductor device having a pixel matrix circuit that includes a pixel TFT and a storage capacitor formed in n-channel TFT, characterized in that:

the pixel TFT has a structure that an active layer is sandwiched by a first wiring line and a second wiring line through an insulating layer, the second wiring line has a portion of structure laminated with a first conductive layer and a second conductive layer, and a portion of structure wrapped a third conductive layer with the first conductive layer and the second conductive layer.

According to another structure of the present invention, a semiconductor device having a pixel matrix circuit and a driver circuit that are formed on the same substrate, characterized in that:

a pixel TFT included in the pixel matrix circuit and an n-channel TFT included in the driver circuit have a structure that an active layer is sandwiched by a first wiring line and a second wiring line through an insulating layer; and the first wiring line connected to the pixel TFT is kept at the fixed electric potential or the floating electric potential, and the first wiring connected to the n-channel TFT included in the driver circuit is kept at the same level of electric potential as the second wiring line connected to the n-channel TFT included in the said driver circuit.

In the above structures, the active layer includes a low concentration impurity region that is in contact with the channel formation region and the low concentration impurity region is formed to overlap the first wiring line and not to overlap the second wiring line.

Further, the second wiring line has a portion of structure laminated with a first conductive layer and a second conductive layer, and a portion of structure wrapped a third conductive layer with the first conductive layer and the second conductive layer.

According to another structure of the present invention, manufacturing method of a semiconductor device including a CMOS circuit formed by n-channel TFT and p-channel TFT comprising:

a process of forming a first wiring line on a substrate, a process of forming a first insulating layer on the first wiring line, a process of forming active layers, an active layer of the n-channel TFT and an active layer of the p-channel TFT, on the first insulating layer, a process of forming a second insulating layer by overlapping the active layer of n-channel TFT and the active layer of p-channel layer, and a process of forming a second wiring line on the second insulating layer, and characterized in that the first wiring line is formed to cross only with the active layer of n-channel TFT. In the above structures, the second wiring line has a portion of structure laminated with a first conductive layer and a second conductive layer, and a portion of structure wrapped a third conductive layer with the first conductive layer and the second conductive layer.

According to another structure of the present invention, manufacturing method of a semiconductor device including a CMOS circuit formed by n-channel TFT and p-channel TFT comprising:

a process of forming a first wiring line on a substrate, a process of forming a first insulating layer on the first wiring line, a process of forming active layers, an active layer of the n-channel TFT and an active layer of the p-channel TFT, on the first insulating layer, a process of forming a second insulating layer by overlapping the active layer of n-channel TFT and the active layer of p-channel layer, and a process of forming a first conductive layer on the second insulating layer, a process of forming a patterned third conductive layer on the first conductive layer, and a process of forming a second conductive layer by overlapping the third conductive layer; and characterized in that the first wiring line is formed to cross only with the active layer of n-channel TFT.

DETAILED DESCRIPTION OF THE INVENTION

An embodiment mode of the present invention will be described taking as an example a CMOS circuit (inverter circuit) in which an n-channel TFT (hereinafter referred to as NTFT) is combined with a p-channel TFT (hereinafter referred to as PTFT).

Figure 1A:
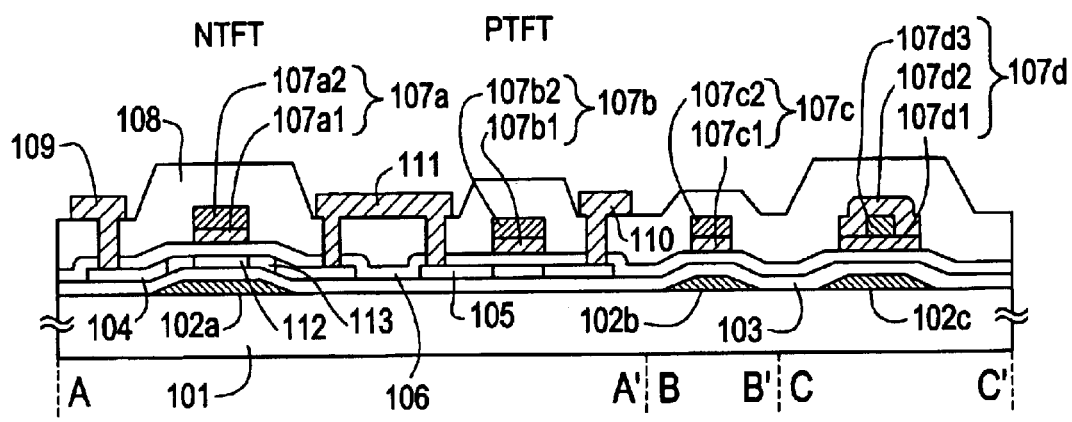
[FIG. 1] shows a structure of a CMOS circuit.
Figure 1B:
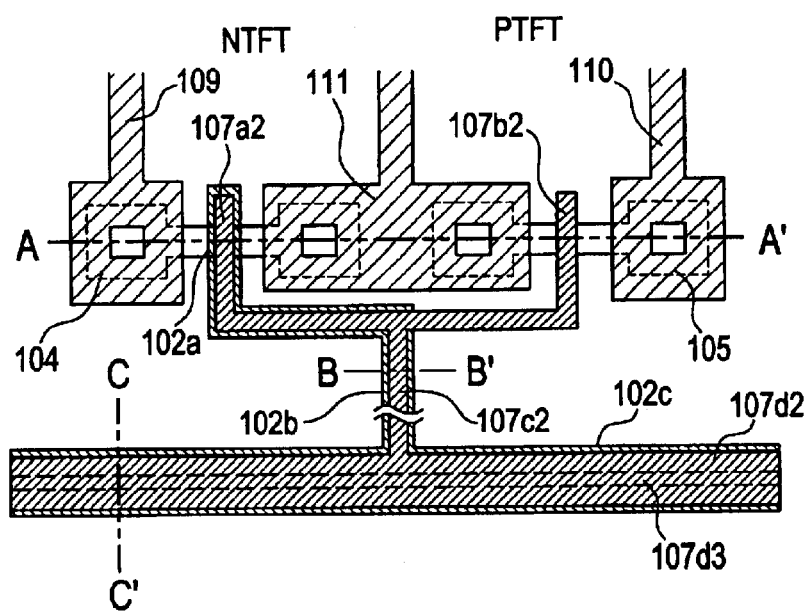

A sectional structure thereof is shown in FIG. 1A and a top view thereof is shown in FIG. 1B. The description will be given using symbols common to FIG. 1A and FIG. 1B. The sectional views taken along the lines A–A', B–B', and C–C' in FIG. 1B correspond to the sectional views A–A', B–B', and C–C' in FIG. 1A, respectively.

In FIG. 1A, 101 denotes a substrate; 102*a*, 102*b*, and 102*c*, first wiring lines; 103, a first insulating layer; 104, an active layer of NTFT; 105, an active layer of PTFT; and 106, a second insulating layer.

On that, a second wiring line 107*a* laminated with a first conductive layer 107*a*1 and a second conductive layer 107*a*2, similarly a second wiring line 107*b* laminated with a first conductive layer 107*b*1 and a second conductive layer 107b2, a second wiring line 107c laminated with a first conductive layer 107c1 and a second conductive layer 107c2, and a second wiring line 107d which has a structure of sandwiching a third conductive layer d3 with a first conductive layer 107d1 and a second conductive layer 107d2.

108 is a first interlayer insulating layer, 109 to 111 are third wiring lines, 109 and 110 are source wiring lines (including source electrodes), and 111 is a drain wiring line (including a drain electrode).

In the CMOS circuit structured as above, a glass substrate, a quartz substrate, a metal substrate, a stainless steel substrate, a plastic substrate, a ceramic substrate, or a silicon substrate may be used as the substrate 101. When a silicon substrate is used, it is appropriate to oxidize its surface to form a silicon oxide film in advance.

Although the first wiring line is a wiring line of the same pattern as shown in FIG. 1B, it is sectioned into 102a, 102b, and 102c for the sake of explanation. Here, the first wiring line 102a represents an intersection with the active layer, the first wiring line 102b represents a connection between the TFTs, and the first wiring line 102c represents a power supplying portion common to the circuits.

The first wiring line 102a here functions as a subordinate gate electrode of the NTFT. That is, the electric charge of the channel formation region 112 is controlled by the first wiring line 102a and by the second wiring line (main gate electrode) 107a that is given with the same level of electric potential as the first wiring line 102a, so that only the first wiring line 102a can apply a gate voltage (or a predetermined voltage) to the LDD regions 113.

Accordingly, the GOLD structure cannot be obtained with the second wiring line 107a alone functioning as the gate electrode (the LDD structure is obtained instead), not until the first wiring line 102a joins with the second wiring line 113a. Advantages of this structure will be described later. The first wiring line 102a also functions as a light-shielding layer.

Any material can be used for the first wiring line as long as it has conductivity. However, a desirable material would be one having heat resistance against the temperature in a later process. For example, a conductive film mainly containing (50% or more composition ratio) an element selected from the group consisting of tantalum (Ta), titanium (Ti), tungsten (W), molybdenum (Mo), and silicon (Si), or an alloy film or silicide film containing the above elements in combination.

Given as a feature of this embodiment mode is providing the first wiring line 102a in the NTFT only and not in the PTFT. Although the PTFT in FIG. 1A does not have an offset region and an LDD region either, one of the regions or both of the regions may be formed in the PTFT.

Structured as above, the first wiring line is led from the power supplying portion through the connection to the NTFT to function as a subordinate gate electrode of the NTFT as shown in FIG. 1B.

The second wiring line is also a wiring line of the same pattern but, for the sake of explanation, is sectioned almost the same way the first wiring line is sectioned. In FIG. 1A, 107a represents an intersection with the active layer of the NTFT 104, 107b represents an intersection with the active layer of the PTFT 105, 107c represents a connection between the TFTs, and 107d represents a power supplying portion.

A second wiring line is formed by laminating two kinds of conductive layers basically. Any upper layer and any lower layer can be used as long as it has a conductivity, a tantalum (Ta) film, a chromium (Cr) film, a titanium (Ti) film, a tungsten (W) film, a molybdenum (Mo) film, and a silicon (Si) film may be used in any combination to form the second wiring lines. An alloy film or silicide film of those may also be used.

It is necessary to select material possible to pattern to the same form after laminating. That is, the combination, which after laminating enables to etch collectively or to etch the side of lower layers by masking the side of upper layers, is desirable. And a conductive layer provided in lower layers must have a positive selective ratio of etching with the third conductive layer 107d3.

The third conductive layer 107d3 is a conductive film mainly containing aluminum (Al) or copper (Cu), which component ratio is more than 50%, and the second wiring line is formed by structure wrapped with the first conductive layer 107d1 and the second conductive layer 107d2 (hereinafter referred to as a cladding structure). This second wiring line 107d forms a wiring line equal to the part of power supply.

The CMOS circuit is an inverter circuit much used as a driver circuit of AM-LCD and other signal process circuits. Since these driver circuit and signal process circuit are integrated in high density, it is desireble to make the width of the wiring line narrow to the utmost. Therefore, the part of crossing (a gate electrode portion) and the part of connecting (a portion drawing wiring lines) with active layers are designed as narrow as possible. And the length of a wiring line itself in these parts is not so long that it is hardly affected by resistance of wiring lines.

In the power supply portion, however, the length of a wiring line itself is so long that it is much affected by resistance of wiring lines. So that, in the present embodiment mode, material mainly containing aluminum and copper with low resistance is used to reduce resistance of wiring lines. In structure such as the second wiring line 107d, the width of wiring lines is a little wide, but it is no problem because the power supply portion is formed in the outside of complicatedly integrated circuits.

Like an AM-LCD having a diagonal size of 4 inch or less, in the case of applying the present invention to the semiconductor device with wholly small circuits and without extremely long wiring lines, a wiring line as the power supply portion is also so short that it is unnecessary to use the above-mentioned cladding structure. In other words, it can be said that the structure as shown in FIG. 1 is effective in an AM-LCD having a diagonal size of 4 inch or more.

As described above, the CMOS circuit of this embodiment mode has the two characteristics as follows;
1. The first wiring line (subordinate gate wiring line) is provided only in the NTFT and the same level of voltage as the second wiring line (main gate wiring line) or a predetermined voltage is applied to the first wiring line, thereby giving the NTFT the GOLD structure.
2. The gate electrode portion and the connecting portion of the second wiring line are made narrow and integrated, and the power supply portion is made low resistance by a structure sandwiching the third conductive layer having low resistance with the first and the second conductive layers (the cladding structure).

An embodiment mode of the present invention will be described taking as an example a pixel matrix circuit that uses an NTFT for a pixel TFT. This pixel matrix circuit is formed on the same substrate as the CMOS circuit described in Embodiment Mode 1 at the same time. Therefore, see the description in Embodiment Mode 1 for details of the wiring lines of the identical names.

Figure 2A:
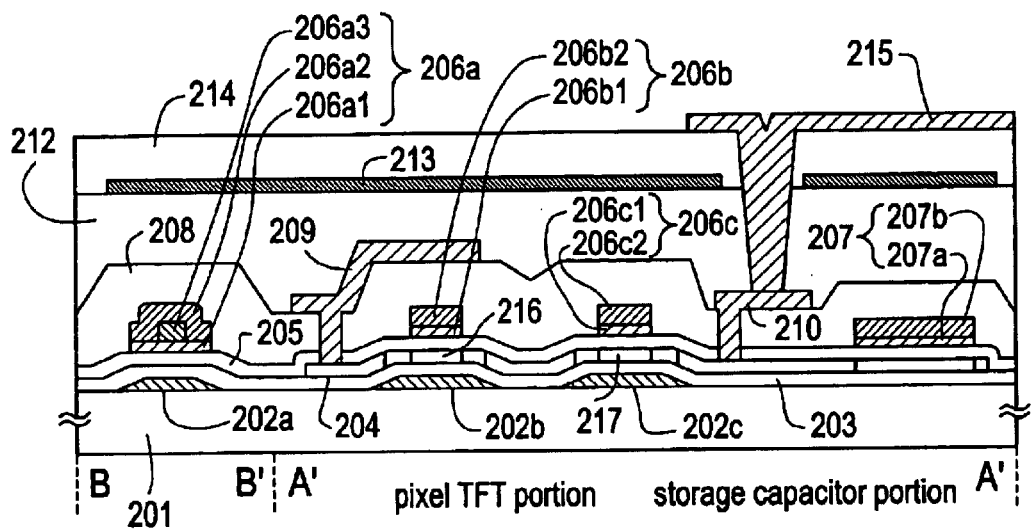
[FIG. 2] shows a structure of a pixel matrix circuit.
Figure 2B:
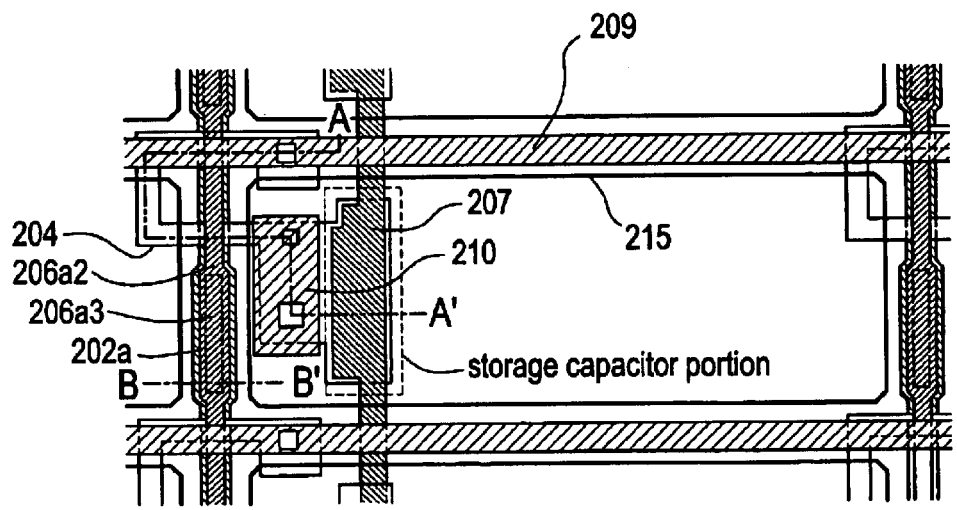

A sectional structure of the pixel matrix circuit is shown in FIG. 2A and a top view thereof is shown in FIG. 2B. The description will be given using symbols common to FIG. 2A and FIG. 2B. The sectional views taken along the lines A–A' and B–B' in FIG. 2B correspond to the sectional views A–A' and B–B' in FIG. 2A, respectively In FIG. 2A, 201 denotes a substrate; 202a, 202b and 202c, first wiring lines; 203, a first insulating layer; 204, an active layer of a pixel TFT (NTFT); and 205, a second insulating layer. The pixel TFT shown here as an example has a double gate structure, but it may have a single gate structure or a multi-gate structure in which three or more TFTs are connected in series.

On the second insulating layer 203, a second wiring line 206a having a structure of sandwiching a third conductive layer 206a3 with a first conductive layer 206a1 and a second conductive layer 206a2, a second wiring line 206b laminated a first conductive layer 206b1 and a second conductive layer 206b2, a second wiring line 206c laminated a first conductive layer 206c1 and a second conductive layer 206c2, and a capacitor wiring line 207 laminated a first conductive layer 207a and a second conductive layer 207b.

Here, a storage capacitor is formed between the capacitor wiring line 207 and an active layer 204 (namely, a region extended from the drain region 207) with the first insulating layer 205 as dielectric. In this case, the first insulating layer 205 is put on a silicon nitride film as a laminated structure with a silicon oxide film and a second wiring line is formed after removing a silicon oxide film to be the part of the storage capacitor selectively, and then it is realized that the storage capacitor has only a silicon nitride film with high dielectric constant as a dielectric.

Denoted by 208 is a first interlayer insulating layer, 209 and 210, third wiring lines, 209, a source wiring line (including a source electrode), and 215, a drain wiring line (including a drain electrode). Formed thereon are a second interlayer insulating layer 211, a black mask 212, a third interlayer insulating layer 213, and a pixel electrode 214.

Although the first wiring line is a wiring line of the same pattern as shown in FIG. 2B, it is sectioned into 202a, 202b, and 202c for the sake of explanation. Here, the first wiring line 202a represents a wiring line portion that does not function as a gate electrode, whereas 202b and 202c are intersections with the active layer 204 and function as the gate electrodes.

The first wiring lines shown here are formed at the same time the first wiring lines described in Embodiment Mode 1 are formed. Therefore the material and other explanations thereof are omitted.

The first wiring lines 202b and 202c function as light-shielding films of the pixel TFT. In other words, they do not have the function of the subordinate gate wiring line as the one described in Embodiment Mode 1, and are given a fixed electric potential or set to a floating state (an electrically isolated state). The fixed electric potential is given a ground electric potential or a power supply electric potential (at the same level of electric potential as a source wiring line). By that, holes generated by hot carrier injection can be removed from the channel formation regions and as a result electric charge is neutralized to disappear hot carrier.

Electric charges in the channel formation regions 215 and 216 are thus controlled by the first wiring lines 206b and 206c to provide the LDD structure. Therefore an increase in OFF current can be contained effectively.

The pixel matrix circuit shown in this embodiment mode thus has an NTFT as its pixel TFT, and the structure of the NTFT is the same as the NTFT of the CMOS circuit explained in Embodiment Mode 1. However, the NTFT in the pixel matrix circuit is different from the NTFT in the CMOS circuit where the GOLD structure is obtained by using the first wiring line as a subordinate gate wiring line through application of a predetermined voltage, in that the LDD structure is obtained by giving the first wiring lines a fixed electric potential or setting them to a floating state.

In other words, the biggest feature of the present invention is that NTFTs having the same structure are formed on the same substrate and then they are respectively given the GOLD structure or the LDD structure by being applied or not being applied a voltage to their first wiring lines (subordinate gate wiring lines). This makes the optimal circuit design possible without increasing the number of manufacture steps.

In second wiring lines 206a, 206b and 206c, 206b and 206c are gate electrode portions and 206a is a wiring line portion. Since it is desirable that resistance of the wiring line is lowered as much as possible in the wiring line portion, a cladding structure is adopted. But in the gate electrode portion, since the width of wiring lines decides the length of a channel, it is designed to make the width of lines narrow by laminating the first conductive layer and the second conductive layer.

Details and effect of the cladding structure is explained in Embodiment Mode 1, therefore explanation is omitted here. And as described in Embodiment Mode 1, needless to say, it is unnecessary that an AM-LCD having a diagonal size of 4 inch or less adopts a cladding structure.

The structures of the present invention in the above will be described in detail in the following embodiments.

Embodiment 1

In this embodiment, a method of manufacturing the CMOS circuit described in Embodiment Mode 1 will be described. The description will be given with reference to FIG. 3.

First, a glass substrate is prepared as a substrate 301. On the base film, first wiring lines 302a, 302b, and 302c are formed. The material of the first wiring lines is a laminated film, which a tungsten silicide (WSix) film and a silicon film are laminated in order by sputtering. The order of laminating can of course be reversed and the CVD method can be used as means of depositing. And to form oxide film on a surface after forming the above-mentioned laminated films is effective in the sense of protection of the surface.

Other metal films, alloy films, or the like may of course be used because the first wiring lines 302a, 302b, and 302c can be formed of any film as long as it has conductivity. A chromium film or a tantalum film that can be formed by patterning with a small taper angle is effective in improving the levelness.

A second insulating layer 303 is formed next from an insulating film containing silicon. The first insulating layer 303 functions as a gate insulating film in using the first wiring line 302a as a subordinate gate wiring line as well as performs as a base film to protect an active layer.

This embodiment employs a layered structure in which a silicon nitride film with a thickness of 50 nm is formed first and a silicon oxide film with a thickness of 80 nm is formed thereon. It may of course be a silicon oxynitride film expressed as SiOxNy (x/y=0.01 to 100). In this case, the withstand voltage thereof can be enhanced by making the nitrogen content larger than the oxygen content.

Next, an amorphous silicon film (not shown in the drawing) with a thickness of 50 nm is formed and a crystalline silicon film is formed by crystallizing using a known laser crystallization technique. And the crystalline silicon film is patterned to form active layers 304 and 305. In process of crystallization in this embodiment, an amorphous silicon film is irradiated by processing the pulse-oscillating typed excimer laser light into a linear beam.

Although this embodiment uses as a semiconductor film for the active layers a crystalline silicon film obtained by crystallizing an amorphous silicon film, other semiconductor films such as a microcrystalline silicon film may be used or a crystalline silicon film may be formed directly. Other than silicon films, a compound semiconductor film such as a silicon germanium film may be used.

A second insulating layer 306 is formed next from a silicon oxide film, a silicon oxynitride film, or a silicon nitride film, or a laminate of those so as to cover the active layers 304 and 305. A silicon oxynitride film is formed here by plasma CVD to a thickness of 100 nm. The second insulating layer functions as a gate insulating film when a second wiring line is used as a main gate wiring line.

Next, a tantalum film 307 with a thickness of 20 nm is formed as a first conductive layer and thereon a third conductive layer 308 made by an aluminum film doped scandium is formed. And a second conductive layer 309 made by a tantalum film is formed to have a thickness of 200 nm. Either sputtering or CVD can be used to form these films.

Figure 3A:
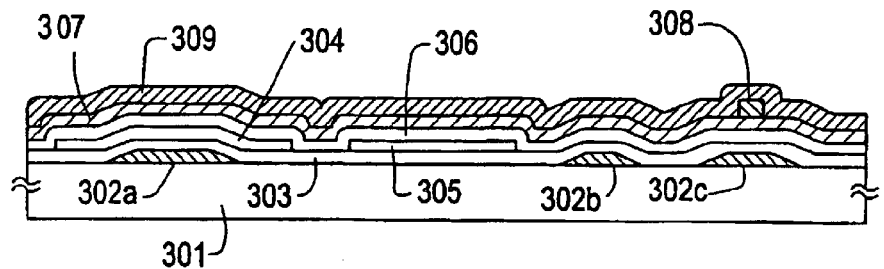
[FIG. 3] shows a process of manufacturing a CMOS circuit.

After the state of FIG. 3A is thus obtained, resist masks 310 and 311 are formed to etch the first conductive layer 307 and the second conductive layer 309. In this way, a second wiring line 312 is formed from the laminated structure of the tantalum film. The second wiring line 312 corresponds to the second wiring line (main gate wiring line) 107a in FIG. 1A.

Figure 3B:
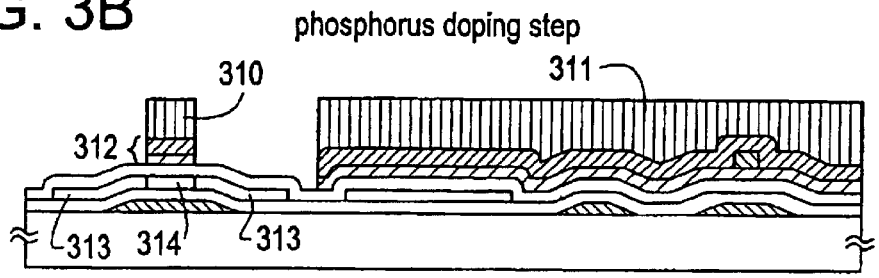

Next, the film is doped with an element belonging to Group 15 (typically, phosphorus or arsenic) to form low concentration impurity regions 313. A channel formation region of the NTFT is defined simultaneously. In this embodiment, phosphorus is used as the element belonging to Group 15, and ion doping that does not involve mass separation is employed. (FIG. 3B)

Doping conditions include setting the acceleration voltage to 90 keV, and adjusting the dose so that phosphorus is contained in a concentration of $1\times10^{16}$ to $1\times10^{19}$ atoms/cm$^3$ (preferably $5\times10^{17}$ to $5\times10^{18}$ atoms/cm$^3$). This concentration later sets the impurity concentration in the LDD regions, and hence is needed to be controlled precisely.

The resist masks 310 and 311 are then removed and resist masks 315 to 318 are newly formed. The first conductive layer 307 and the second conductive layer 309 are etched to form second wiring lines 319 to 321. The second wiring lines 319, 320 and 321 respectively correspond to the second wiring lines 107b, 107c and 107d of FIG. 1A.

Figure 3C:
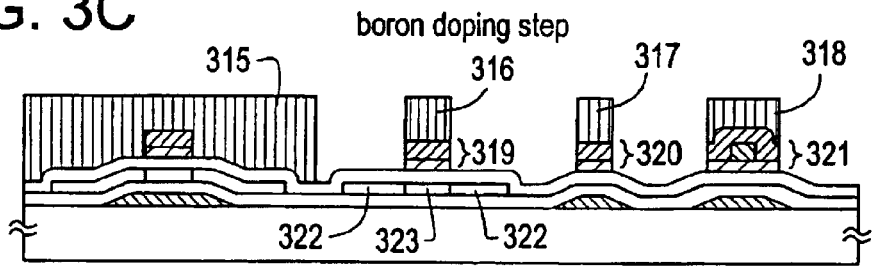

Next, the film is doped with an element belonging to Group 13 (typically boron or gallium) to form an impurity region 322. A channel formation region 323 of the PTFT is defined simultaneously. In this embodiment, boron is used as the element belonging to Group 13, and ion doping that does not involve mass separation is employed. (FIG. 3C)

Doping conditions include setting the acceleration voltage to 75 keV, and adjusting the dose so that boron is contained in a concentration of $1\times10^{19}$ to $5\times10^{21}$ atoms/cm$^3$ (preferably $1\times10^{20}$ to $1\times10^{21}$ atoms/cm$^3$).

The resist masks 315 to 318 are then removed and resist masks 324 to 327 are formed again. In this embodiment, the resist masks are formed by a back side exposure method. For the resist masks 324, 326 and 327, the first wiring lines serve as masks whereas the second wiring lines serve as masks for the resist mask 325. With the first wiring lines as masks, a small amount of light reaches behind the wiring lines and hence the line width in this case is narrower than the width of the first wiring lines. The line width can be controlled by exposure conditions.

The resist masks can of course be formed by using masks instead. In this case, the degree of freedom in pattern design is raised but the number of masks is increased.

After the resist masks 324 to 327 are thus formed, a step of doping with an element belonging to Group 15 (phosphorus in this embodiment) is conducted. Here, the acceleration voltage is set to 90 keV, and the dose is adjusted so that phosphorus is contained in a concentration of $1\times10^{19}$ to $5\times10^{21}$ atoms/cm$^3$ (preferably $1\times10^{20}$ to $1\times10^{21}$ atoms/cm$^3$).

Through this step, a source region 328, a drain region 329 and an LDD region 330 of the NTFT are defined. And a source region 331 and a drain region 332 of the PTFT are defined. A source region and a drain region of the PTFT are also doped with phosphorus in this step. However, the P type conductivity thereof can be maintained and is not reversed to the N type conductivity if they are doped with boron in a higher concentration in the previous step.

After the NTFT and the PTFT are thus doped with impurity elements each imparting one of the conductivity types, the impurity elements are activated by furnace annealing, laser annealing, or lamp annealing, or by using these annealing methods in combination.

Figure 3D:
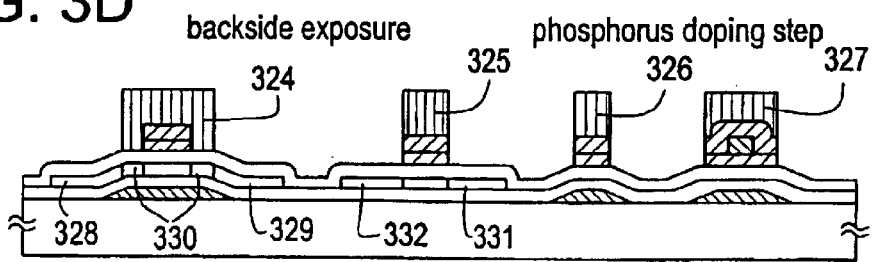

The state of FIG. 3D is obtained in this way. Then a first interlayer insulating layer 333 is formed from a silicon oxide film, a silicon nitride film, a silicon oxynitride film, or a resin film, or from a laminate of those films. Contact holes are opened in the layer to form source wiring lines 334 and 335 and a drain wiring line 336. (FIG. 3E).

The first interlayer insulating layer 333 in this embodiment has a two-layer structure in which a silicon nitride film with a thickness of 50 nm is formed first and a silicon oxide film with a thickness of 950 nm is formed thereon. The source wiring lines and the drain wiring line in this embodiment are formed by patterning a three-layer structure laminate obtained by successively forming, by sputtering, a titanium film with a thickness of 100 nm, an aluminum film containing titanium and having a thickness of 300 nm, and another titanium film with a thickness of 150 nm.

Figure 3E:
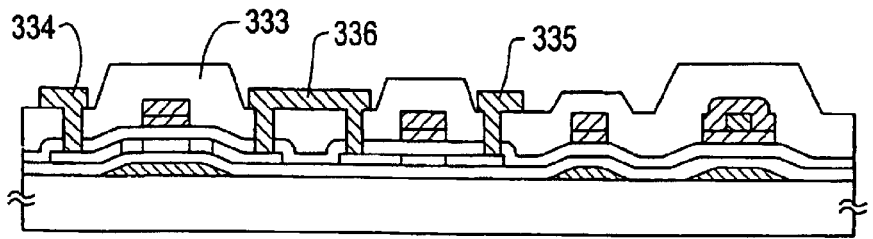

A CMOS circuit structured as shown in FIG. 3E is thus completed. The CMOS circuit of this embodiment has the structure shown in FIG. 1A, and explanations thereof are omitted here because it is described in detail in Embodiment Mode 1. To obtain the structure of FIG. 1A, the manufacturing process is not necessarily limited to the process of this embodiment. For example, the NTFT may take the double gate structure while the PTFT is given the single gate structure.

The CMOS circuit described in this embodiment serves as a basic unit circuit for constructing a driver (driving) circuit (including a shift register circuit, a buffer circuit, a level shifter circuit, a sampling circuit, etc.) and other signal processing circuits (such as a divider circuit, a D/A converter circuit, a γ correction circuit, and an operation amplifier circuit) in an AM-LCD.

In this embodiment, the first wiring line of the NTFT is used as a subordinate gate wiring line to thereby obtain a substantial GOLD structure and prevent degradation by hot carrier injection. Accordingly, a circuit having a very high reliability can be formed.

By narrowing the width of wiring lines in the high integrated part and by a cladding structure in the not so high integrated part (an electric power supplying portion), resistance of wiring lines is reduced, and it is a structure to reduce the delayed time because of resistance of wiring lines.

Embodiment 2

In this embodiment, a method of manufacturing the pixel matrix circuit described in Embodiment Mode 2 will be described. The description will be given with reference to FIGS. 4 and 5. The pixel matrix circuit is formed on the same substrate as the CMOS circuit shown in Embodiment 1 at the same time. Therefore, the description will be given in relation to the manufacturing process of Embodiment 1 and the symbols identical with those in FIG. 3 are used when necessary.

First, second wiring lines 401a, 401b, and 401c are formed on the glass substrate 301. The material of the second wiring lines is as described in Embodiment 1. Next, a first insulating layer 303, an active layer of a pixel TFT 402, a second insulating layer 306, a first conductive layer 307, a third conductive layer 403 and a second conductive layer 309 are formed consulting Embodiment 1. Thus obtained is the state of FIG. 4A. The CMOS circuit being formed simultaneously is now in the state of FIG. 3A.

Next, resist masks 404 to 407 are formed to etch the first conductive layer 307 and the second conductive layer 309. Second wiring lines 408 and 409 and a capacitor wiring line 410 are thus formed. The second wiring line 408 corresponds to the second wiring line 206b in FIG. 2A and the second wiring line 409 corresponds to the second wiring line 206c in FIG. 2A. And the capacitor wiring line 410 corresponds to the capacitor wiring line 207 in FIG. 2A.

Figure 4A:
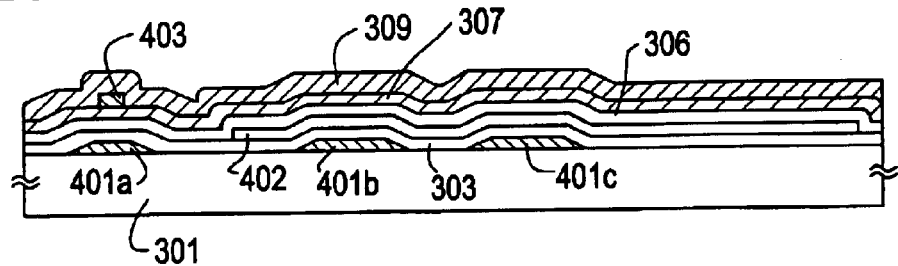
[FIG. 4] shows a process of manufacturing a pixel matrix circuit.
Figure 4B:
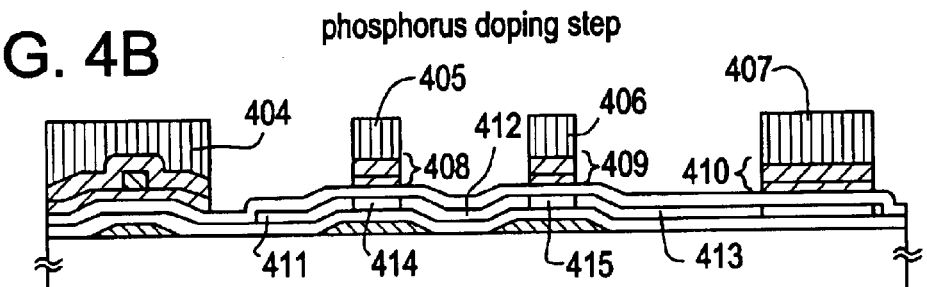

The phosphorus doping step for forming LDD regions later is conducted next to form low concentration impurity regions 411 to 413. Channel formation regions 414 and 415 are defined simultaneously. This step corresponds to the step of FIG. 3B. Accordingly, the material and the thickness of the second wiring lines and phosphorus doping conditions in the step of FIG. 4B are the same as Embodiment 1.

A step corresponding to the step of FIG. 3C is conducted next. First, resist masks 416 and 417 are formed to etch the first conductive layer 307 and the second conductive layer 309, and thus a second wiring line 418 is formed. This second wiring line 418 corresponds to the second wiring line 206a in FIG. 2A.

Figure 4C:
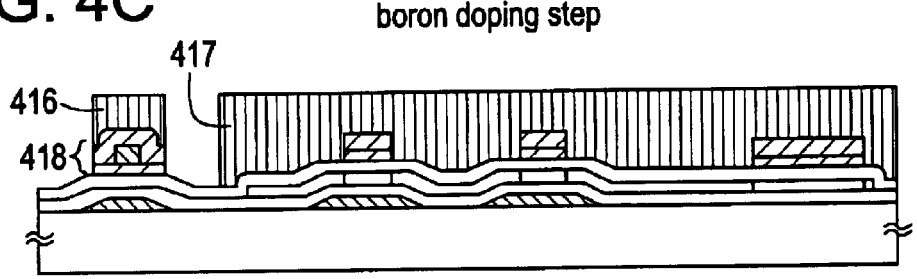

Next, the boron doping step for forming a CMOS circuit is conducted. In this Embodiment, the entire surface of the pixel matrix circuit is covered with a resist mask 417 because a pixel TFT is formed in NTFT. (FIG. 4C)

The resist mask 416 and 417 are then removed. After that, resist masks 419 to 422 are formed by the back side exposure method. Then the phosphorus doping step is conducted to form a source region 423, a drain region 424 and a LDD region 425. The back side exposure conditions and the phosphorus doping conditions are set in accordance with the step of FIG. 3D in Embodiment 1.

Figure 4D:
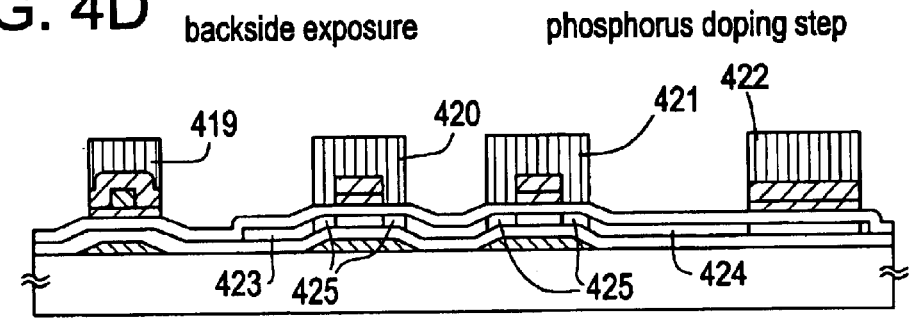

The source region and the drain region in FIG. 4D are named so for the sake of explanation. However, a source region and a drain region in a pixel TFT are reversed when the pixel switches between charging and discharging and hence there is no definite discrimination between the two regions.

Figure 4E:
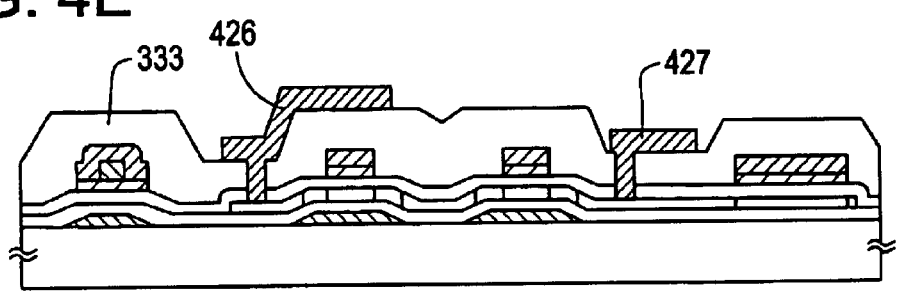

After the doping steps of phosphorus and boron are finished, the impurity elements are activated as in Embodiment 1. Then the first interlayer insulating film 333 is formed and contact holes are opened therein to form a source wiring line 426 and a drain wiring line 427. The state of FIG. 4E is thus obtained. The CMOS circuit at this point is in the state of FIG. 3E.

Next, a second interlayer insulating layer 428 is formed to cover the source wiring line 426 and the drain wiring line 427. In this embodiment, as a passivation film, a silicon nitride film with a thickness of 30 nm is formed and an acrylic film with a thickness of 700 nm is formed thereon. Of course, an insulating film mainly containing silicon such as a silicon oxide film, or other resin films may be used. Other resin films that are usable are a polyimide film, a polyamide film, a BCB (benzocyclobutene) film, and the like.

Next, a black mask 429 is formed from a titanium film having a thickness of 100 nm. Other films may be used to form the black mask 427 if they have light-shielding property. Typically, a chromium film, an aluminum film, a tantalum film, a tungsten film, a molybdenum film, a titanium film, or a laminate of these films is used.

A third interlayer insulating layer 430 is then formed. Though an acrylic film with a thickness of 1 $\mu$m is used in this embodiment, the same material as the second interlayer insulating layer may be used instead.

A contact hole is next formed in the third interlayer insulating layer 430 to form a pixel electrode 431 from a transparent conductive film (typically an ITO film). The pixel electrode 431 is electrically connected to the drain wiring line 427. The contact hole accordingly has to be very deep, and hence it is effective in preventing failure such as break of the pixel electrode to form the contact hole such that its inner wall is tapered or curved.

Figure 5A:
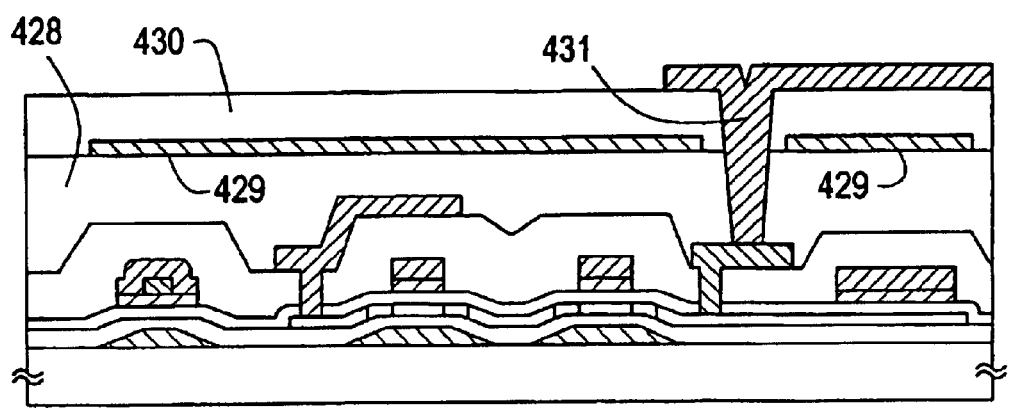
[FIG. 5] shows a process of manufacturing a pixel matrix circuit.

A pixel matrix circuit structured as shown in FIG. 5A is thus completed. Although the example shown in this embodiment is of manufacturing a transmissive AM-LCD using a transparent conductive film for a pixel electrode, a reflective AM-LCD can readily be manufactured if a metal film having high reflectance (such as a metal film mainly containing aluminum) is used for the pixel electrode.

The substrate that has reached the state of FIG. 5A is called an active matrix substrate. This embodiment also describes a case of actually manufacturing an AM-LCD.

After the state of FIG. 5A is obtained, an oriented film 432 with a thickness of 80 nm is formed. An opposite substrate is fabricated next. The opposite substrate prepared is composed of a glass substrate 433 on which a color filter 434, a transparent electrode (opposite electrode) 435, and an oriented film 436 are formed. The oriented films 432 and 435 are subjected to rubbing treatment, and the active matrix substrate is bonded to the opposite substrate using a seal (sealing member). Then a liquid crystal 436 is held between the substrates. A spacer for maintaining the cell gap may be provided if necessary.

Figure 5B:
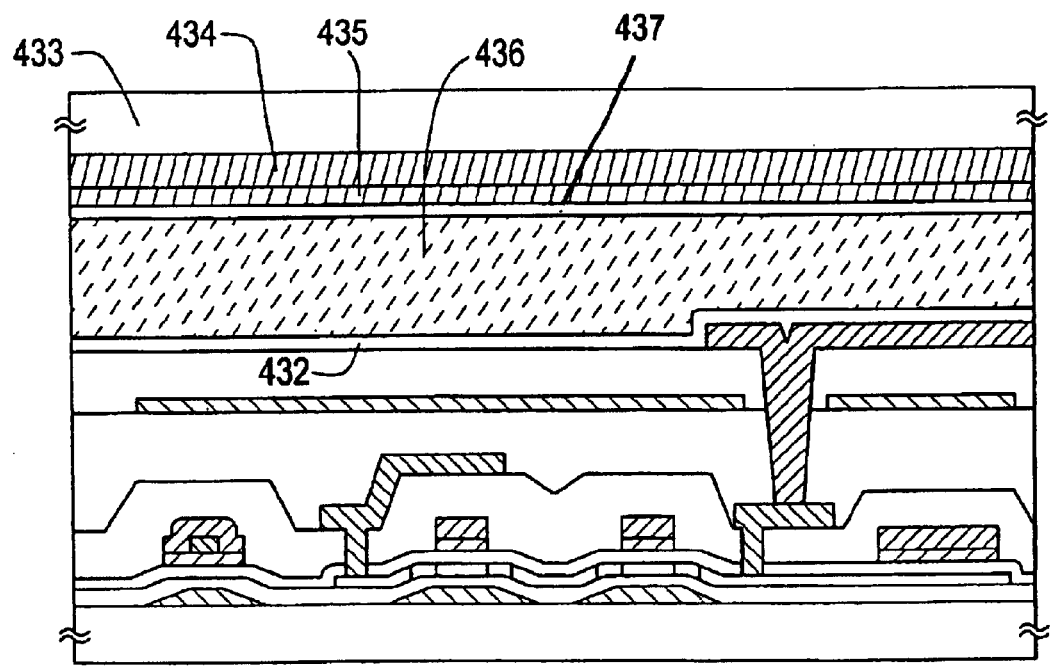

An AM-LCD structured as shown in FIG. 5B (the part corresponding to a pixel matrix circuit) is thus completed. The second interlayer insulating layer 428 and the third interlayer insulating layer 430 of this embodiment also cover the CMOS circuit shown in Embodiment 1 in actuality. Wiring lines may be formed at the same time the black mask 429 and the pixel electrode 431 are formed from the same materials that constitute the black masks and the pixel electrode, so that the wiring lines are used as lead out wiring lines (fourth wiring lines or fifth wiring lines) of a driver circuit and a signal processing circuit of the AM-LCD.

In this embodiment, the first wiring lines 401b and 401c provided in the pixel TFT are set to the fixed electric potential (the ground electric potential or the source electric potential). This makes it possible to draw holes generated in the drain end due to hot carrier injection to the first wiring lines, thereby improving the reliability. The first wiring lines 401b and 401c may of course be set to a floating state, but the hole drawing effect cannot be expected in this case.

As shown in the upper figure of FIG. 2B, the second wiring line 418 deposited in the wiring line portion adopts the cladding structure, which can reduce resistance of wiring lines as much as possible.

Embodiment 3

Figure 6:
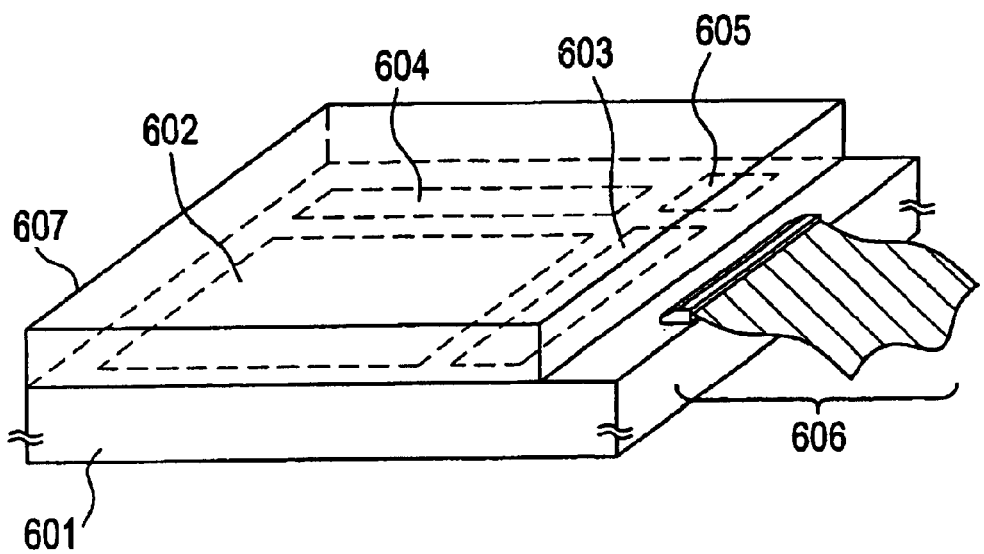
[FIG. 6] shows the outside appearance of AM-LCD.

In this embodiment, an AM-LCD is provided with a pixel matrix circuit and a CMOS circuit (a driver circuit and a signal processing circuit constructed of CMOS circuits, to be exact) according to the present invention, and the appearance thereof is shown in FIG. 6.

On an active matrix substrate 601, a pixel matrix circuit 602, a signal line driving circuit (source driver circuit) 603, scanning line driving circuits (gate driver circuits) 604, and a signal processing circuit (including a signal divider circuit, a D/A converter circuit, and a γ correction circuit) 605 are formed. An FPC (flexible printed circuit) 606 is attached to the active matrix substrate. Denoted by 607 is an opposite substrate.

Figure 7:
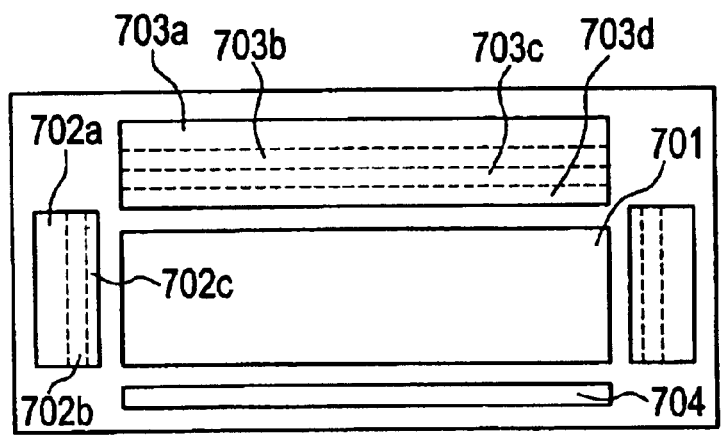
[FIG. 7] shows a block structure of AM-LCD.

The various circuits formed on the active matrix substrate 601 are illustrated in detail in a block diagram of FIG. 7.

In FIG. 7, 701 denotes a pixel matrix circuit that functions as an image display unit. 702a, 702b, and 702c represent a shift register circuit, a level shifter circuit, and a buffer circuit, respectively. The three together constitute a gate driver circuit.

The block diagram of the AM-LCD in FIG. 7 has a pixel matrix circuit sandwiched between gate driver circuits, which share the same gate wiring lines. This means that application of voltage to the gate wiring lines is still possible even after one of the gate drivers fails, thereby giving the AM-LCD redundancy.

703a, 703b, 703c, and 703d represent a shift register circuit, a level shifter circuit, a buffer circuit, and a sampling circuit, respectively. The four together constitute a source driver circuit. A precharge circuit 14 is placed across the pixel matrix circuit from the source driver circuit.

The reliability of an AM-LCD having circuits as those shown in FIG. 6 can be greatly improved by employing the present invention. In this case, CMOS circuits constituting a driver circuit and a signal processing circuit are made in accordance with Embodiment 1 and a pixel matrix circuit is made in accordance with Embodiment 2.

Embodiment 4

This embodiment gives a description on a case where a CMOS circuit is structured differently from Embodiment 1 and a pixel matrix circuit is structured differently from Embodiment 2. To be specific, circuits are given different structures in accordance with the respective specifications the circuits demand.

The basic structure of the CMOS circuit is identical with the structure shown in FIG. 1A and the basic structure of the pixel matrix circuit is identical with the structure shown in FIG. 2A. Therefore only the part that needs explanation is denoted by a symbol and explained in this embodiment.

Figure 8A:
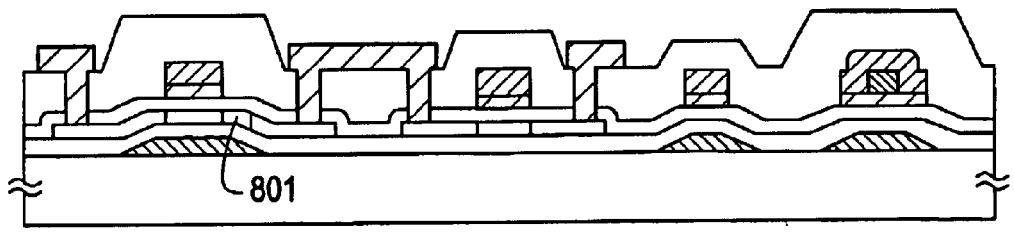
[FIG. 8] shows a structure of a CMOS circuit or a pixel matrix circuit.

The structure shown in FIG. 8A lacks an LDD region on the source side of the NTFT and has an LDD region 801 only on the drain side. The CMOS circuit, which is used in a driver circuit and a signal processing circuit, is required to operate at high speed and hence resist components that can cause reduction in operation speed have to be removed as much as possible.

In the case of the CMOS circuit according to the present invention, a gate voltage is applied to a first wiring line functioning as a subordinate gate wiring line to obtain the GOLD structure and prevent degradation due to hot carrier injection. However, it is sufficient if an LDD region that overlaps a gate electrode is formed at an end of a channel formation region on the drain region side where hot carriers are injected.

Accordingly, an LDD region at an end of the channel formation region on the source region side is not indispensable. On the contrary, the LDD region on the source region side might work as a resist component. The structure shown in FIG. 8A is therefore effective in improving the operation speed.

The structure of FIG. 8A cannot be applied to a circuit that behaves like a pixel TFT in which a source region and a drain region are switched. Since a source region and a drain region of a CMOS circuit are normally fixed, the CMOS circuit can adopt the structure of FIG. 8A.

Figure 8B:
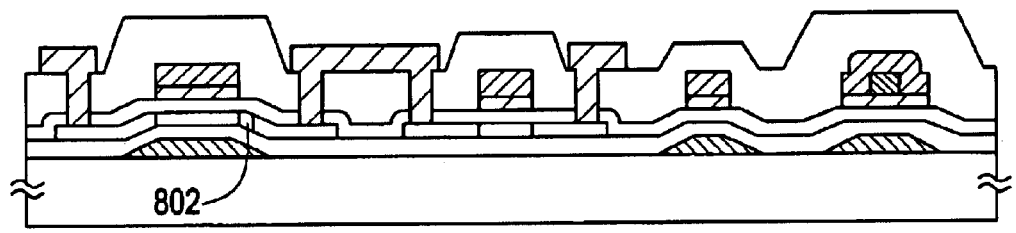

FIG. 8B is basically identical with FIG. 8A but the width of an LDD region 802 in FIG. 8B is narrower than in FIG. 8A. Specifically, the width is set to 0.05 to 0.5 μm (preferably 0.1 0.3 μm). The structure in FIG. 8B is capable of not only reducing the resist component on the source region side but also reducing the resist component on the drain region side as much as possible.

This structure is actually suitable for a circuit that is driven at as low voltage as 3 to 5 V and is required to operate at high speed, such as a shift register circuit. Because of the low operation voltage, the narrow LDD region (LDD region that overlaps a gate electrode, strictly speaking) does not raise the problem related to hot carrier injection.

Of course, LDD regions in the NTFT may be completely omitted in some cases if the omission is limited to the shift register circuit. In this case, the NTFT of the shift register circuit has no LDD region while other circuits in the same driver circuit employ the structure shown in FIG. 1A or the structure shown in FIG. 8B.

Figure 8C:
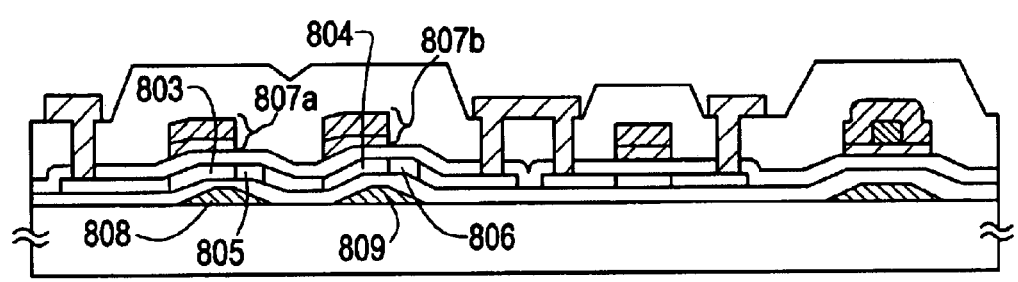

Next, FIG. 8C shows an example of a CMOS circuit with its NTFT having the double gate structure and PTFT having the single gate structure. In this case, LDD regions 805 and 806 are provided only at ends of channel formation regions 803 and 804 which are closer to drain regions.

The width of an LDD region is determined by the amount of light that reaches around in the back side exposure step as shown in FIG. 3D. However, if resist masks are formed by mask alignment, the masks can be designed freely. Forming an LDD region only on one side is easy also in the structure shown in FIG. 8C if a mask is used.

However, forming an LDD region only on one side by the back side exposure method is possible when gate wiring lines (second wiring lines) 807a and 807b are formed so as not to coincide with first wiring lines 808 and 809 as in this embodiment.

This structure can eliminate the resist component by an LDD region on the source side and the double gate structure has an effect of diffusing and easing the electric field applied between the source and the drain.

Figure 8D:
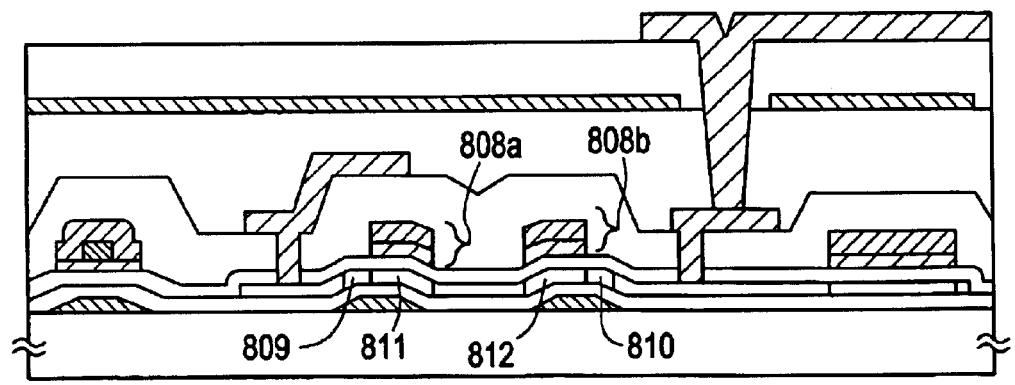

The structure in FIG. 8D is a mode of a pixel matrix circuit. In the structure of FIG. 8D, LDD regions 809 and 810 are provided on either the side closer to the source region or the side closer to the drain region. In other words, no LDD region is provided between two channel formation regions 811 and 812.

In the case of a pixel TFT, a source region and a drain region are frequently switched because charging and discharging are repeated. Accordingly, when the pixel TFT has a structure of FIG. 8D, the LDD region can always be in the channel formation region on the drain region side whichever region serves as the drain region. On the other hand, it is effective in increasing ON current (current flowing when the TFT is in an ON state) to omit an LDD region that can be a resist component between the channel formation regions 811 and 812 because there is no electric field concentration between the channel formation regions.

An LDD region is not provided at an end of the channel formation region on the source region side in the structures of FIGS. 8A to 8D. However, the LDD region may be provided there if it has a narrow width. This structure may be obtained by forming resist masks through mask alignment or by the back side exposure method after the position of the first wiring lines and the second wiring lines is adjusted.

Needless to say, the structure of this embodiment can be combined with Embodiments 1 and 2 and applied to the AM-LCD shown in Embodiment 3.

Embodiment 5

This embodiment shows with reference to FIG. 9 a case of forming a storage capacitor with a different structure from a pixel matrix circuit shown in Embodiment 2. Since the fundamental structure is in the same way as FIG. 2A, only necessary parts are denoted by the symbols in this embodiment.

Figure 9A:
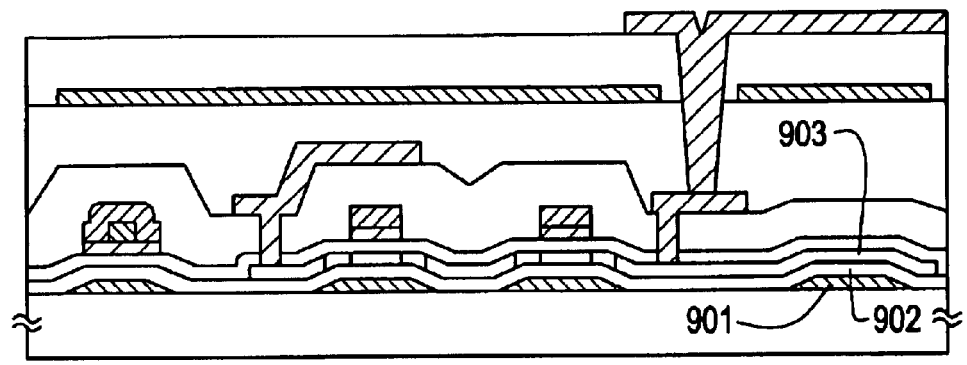
[FIG. 9] shows a process of manufacturing a pixel matrix circuit (specially a storage capacitor).

The structure shown in FIG. 9A uses a capacitor wiring line 901, a first insulating layer 902 and an active layer 903 (strictly speaking, the portion extended from a drain region), which a storage capacitor is formed in the same layer as the first wiring line.

This structure has the advantage of having conductivity by doping elements belonging to Group 13 or 15 into a portion of active layers at high concentration, which functions as an electrode of the storage capacitor. The elements belonging to Group 13 or 15 may of course be formed at the same time as the process of forming a source region or a drain region.

In the case of the structure described in "Embodiment Mode 2", the active layer which functions as the electrode of the storage capacitor is not doped the impurity elements which give conductivity because the second wiring line performs a mask, and must keep the state that an inverse layer is formed in the active layer by adding a voltage at all times. In the structure of FIG. 9A, however, the active layer itself, which functions as the electrode of the storage capacitor, has conductivity, and is not needed to add a voltage and has only to be fixed in the ground electric potential.

Thus, it can be said that it is an effective structure to lower electricity consumption because the voltage is unnecessary to add too much.

Figure 9B:
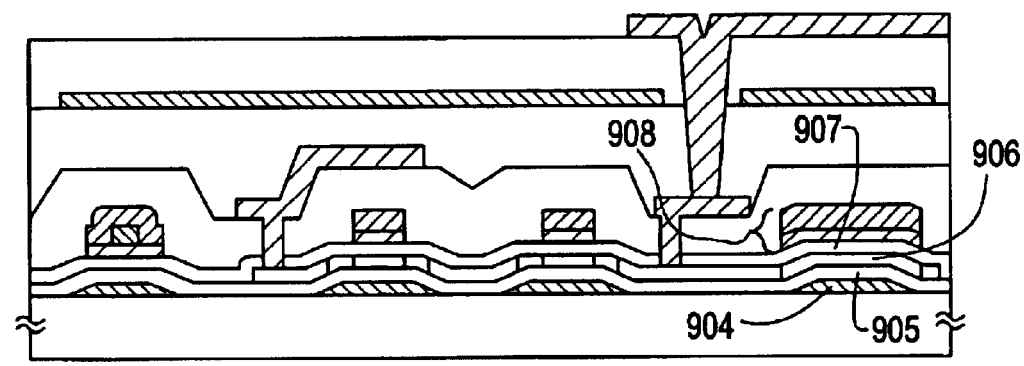

The structure of FIG. 9B is an example of combining the structure of the storage capacitor shown in FIG. 2A with the structure of the storage capacitor shown in FIG. 9A. Concretely, a first storage capacitor is formed by a first capacitor wiring line 904, which is in the same layer as the first wiring line, a first insulating layer 905 and an active layer 906, and a second storage capacitor is formed by an active layer 906, a second insulating layer 907 and a second capacitor wiring line 908, which is in the same layer as the first wiring line.

This structure can ensure a nearly double capacitor of the structure of the storage capacitor shown in FIG. 2A and FIG. 9A without increasing the number of process. Specially, the minute AM-LCD requires the smaller size of the storage capacitor in order to improve the aperture ratio. In such a case, the structure of FIG. 9B is effective.

It is effective to use the structure of this embodiment in AM-LCD shown in Embodiment 3.

Embodiment 6

Figure 10A:
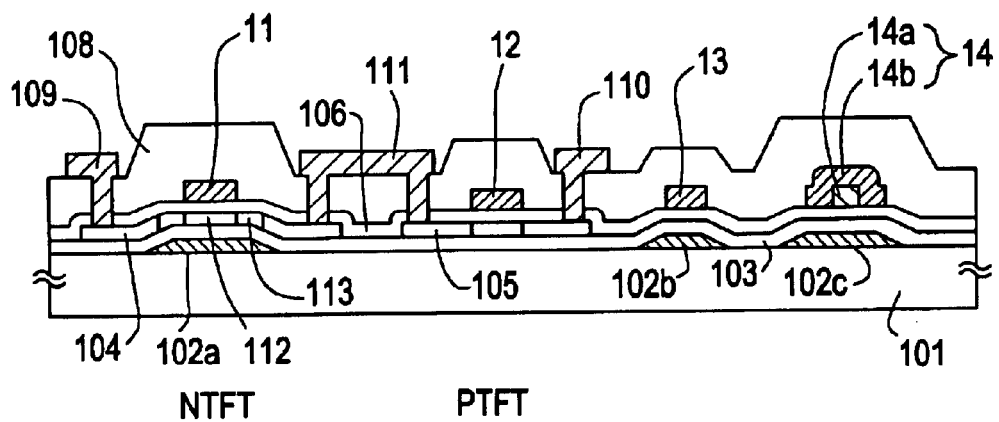
[FIG. 10] shows a structure of a CMOS circuit or a pixel matrix circuit.

This embodiment shows with reference to FIG. 10 a case in which the first conductive layer that consists of the second wiring line in the CMOS circuit of FIG. 1A and in the pixel matrix circuit of FIG. 2A is omitted. In FIG. 10A, parts structured in the same way as FIG. 1A or FIG. 2A are denoted by the same symbols.

In the CMOS circuit shown in FIG. 10A, all of second wiring lines 11 to 13 are formed by a tantalum film with a single layer. Compared with the structure of FIG. 1A, it is a structure omitted the first conductive layer and formed the second wiring line by only the second conductive layer. The thickness is 200 to 400 nm. Except tantalum, a conductive film mainly containing an element selected from the group consisting of chromium, titanium, tungsten, molybdenum, and silicon, or an alloy film or silicide film containing the above elements in combination may of course be used.

With this structure, the power supplying portion (the portion denoted by the cladding structure in FIG. 1A) of the second wiring line has the third conductive layer 14a clad by the second conductive layer 14b. Undesirably, this structure might allow aluminum or copper that is an element constituting the third conductive layer 14a to diffuse into a second insulating layer 106. Therefore a silicon nitride film is formed on the surface of the second insulating layer 106 to prevent diffusion of aluminum or copper effectively.

The structure of this embodiment may also be applied to a pixel matrix circuit. The pixel matrix circuit in FIG. 10B uses a second conductive layer (a single layer of tantalum film in this embodiment) for a second wiring line (a gate wiring line) 16 and 17 and a capacitor wiring line and employs the structure cladding a third conductive layer 15a with a second conductive layer 15b for a part of the gate wiring line that is required to reduce wiring line resistance.

Figure 10B:
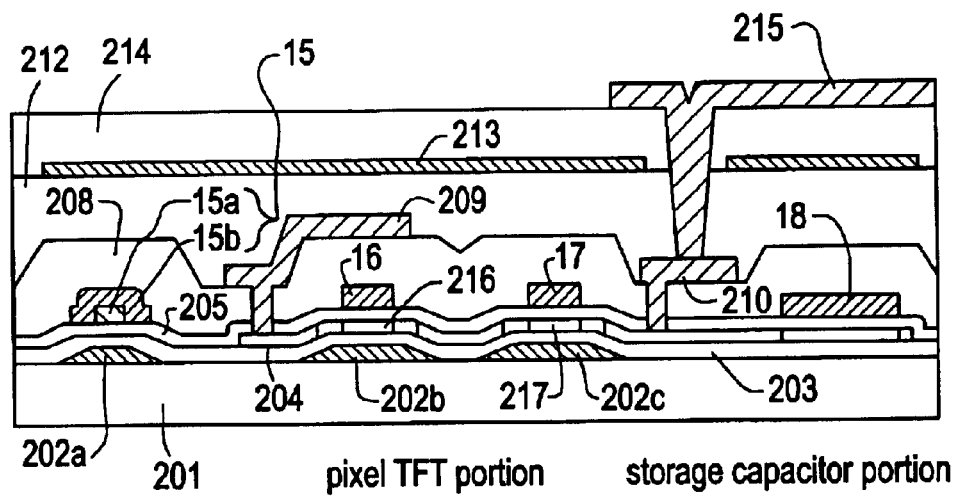

Needless to say, the circuits shown in FIG. 10A and FIG. 10B are both formed on the same substrate at the same time.

The structure of this embodiment can be realized only by omitting a process of forming the first conductive layer in the manufacturing process shown in Embodiment 1 and Embodiment 2. It can also be applied to the AM-LCD of Embodiment 3 and can be combined with the structure shown in Embodiment 4 and 5.

Embodiment 7

Figure 11A:
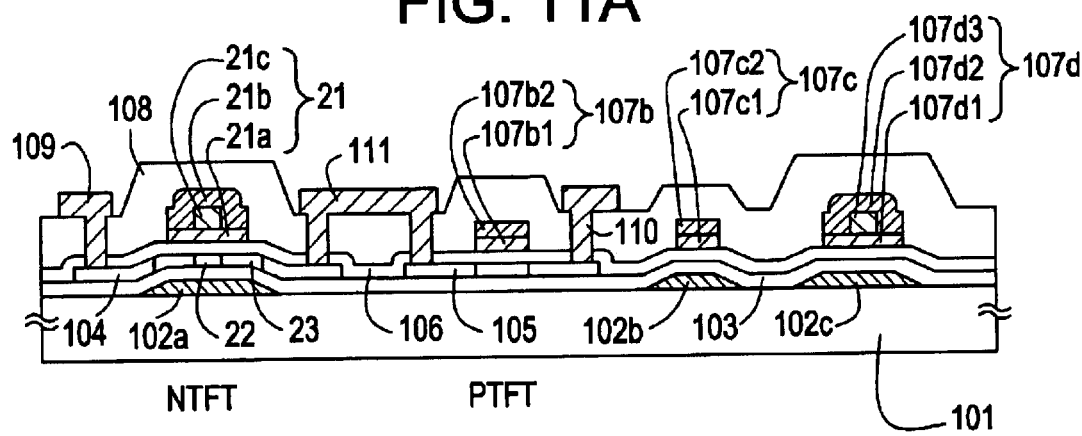
[FIG. 11] shows a structure of a CMOS circuit or a pixel matrix circuit.

This embodiment shows with reference to FIG. 11 a case in which the gate electrode portion of the NTFT is a cladding structure in the CMOS circuit of FIG. 1A and in the pixel matrix circuit of FIG. 2A. In FIG. 11A, parts structured in the same way as FIG. 1A or FIG. 2A are denoted by the same symbols.

In the CMOS circuit shown in FIG. 11A, it is a cladding structure that the gate electrode 21 of the NTFT wraps a third conductive layer 21c with a first conductive layer 21a and a second conductive layer 21b. The length of a channel formation region 22 corresponds to the width of a line of a third conductive layer 21c.

The LDD region 23 can be substantially divided into two regions. On the oneside it overlaps a gate electrode 21, which is a portion of the second wiring line, and on the other side does not overlap the gate electrode 21. In this embodiment, the GOLD structure is realized only with a gate electrode, which is a portion of the second wiring line. Provided the LDD region not overlapped by a gate electrode outside of the LDD region overlapped by a gate electrode, OFF current can be made much smaller.

Figure 11B:
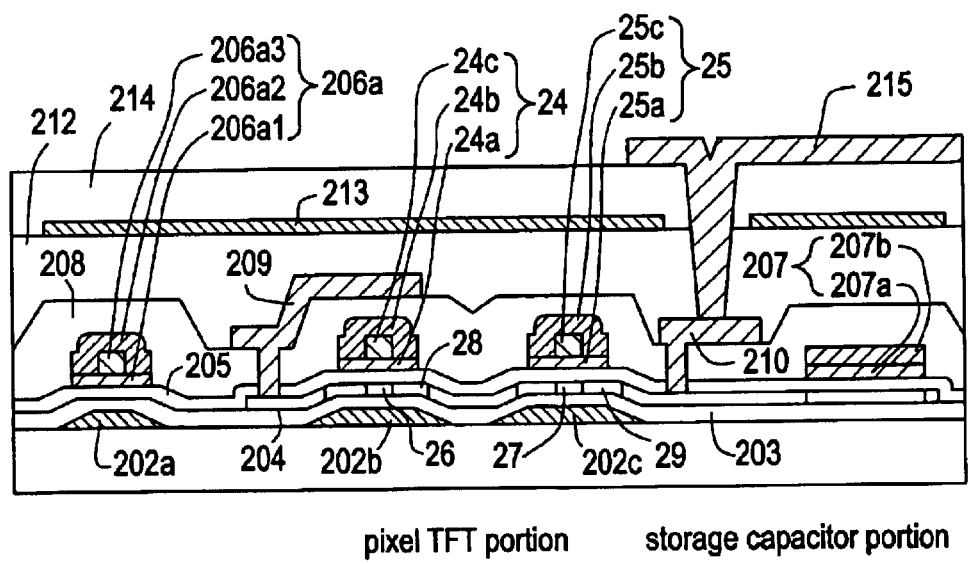

Similarly, in the pixel matrix circuit shown in FIG. 11B, the pixel TFT adopts the cladding structure which both gate electrodes 24 and 25 wrap third conductive layers 24c and 25c with first conductive layers 24a and 25a and second conductive layers 24b and 25b. The length of channel formation regions 26 and 27 correspond to the width of lines of third conductive layers 24c and 25c. Both the LDD regions 28 and 29 can be substantially divided into two regions in the same way as the LDD region 23.

In the case of the structures shown in "Embodiment Mode 1" and "Embodiment Mode 2", while the GOLD structure is realized by adding a gate voltage to the first wiring lines (subordinate gate wiring lines) in the CMOS circuit, the LDD structure is adopted to reduce OFF current in the pixel matrix circuit. But since this is to limit increase in OFF current which cannot be attained by the GOLD structure, the advantage of the GOLD structure which prevents degradation of ON current can not be obtained.

In this embodiment, however, even the pixel matrix circuit is realized the NTFT with the GOLD structure, and obtains more excellent reliability. The very reason for the pixel TFT with the GOLD structure is to provide the LDD region not overlapped by a gate electrode outside of the LDD region overlapped by a gate electrode.

Here, a description is given with reference to FIG. 12 in the manufacturing process to realize the structure of this embodiment. Since it is fundamentally same as the process described in Embodiment 1, the new symbols are used only when necessary.

Figure 12A:
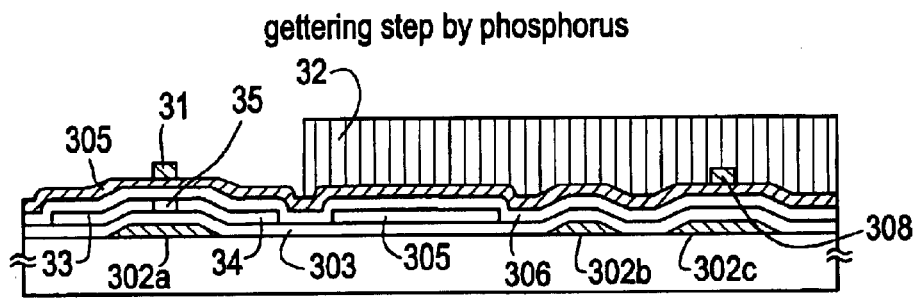
[FIG. 12] shows a process of manufacturing a CMOS circuit.

First, a third conductive layer 308 is formed according to the process of Embodiment 1. In the case of this embodiment, a third conductive layer 31 on the NTFT at the same time as forming the third conductive layer 308. A resist mask 32 is formed, and then the phosphorus doping step is conducted. The doping condition may be referred to the process of FIG. 3B in Embodiment 1. Through this step, the low concentration impurity regions 33 and 34 are formed and the channel formation region 35 is defined. (FIG. 12A)

Figure 12B:
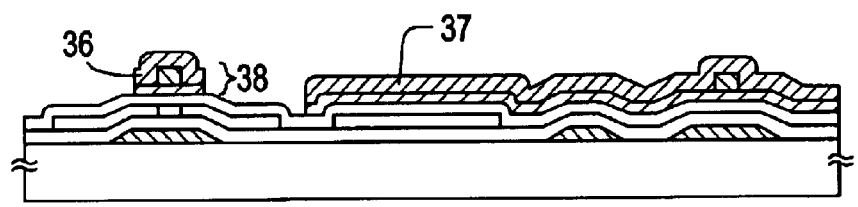
Figure 12C:
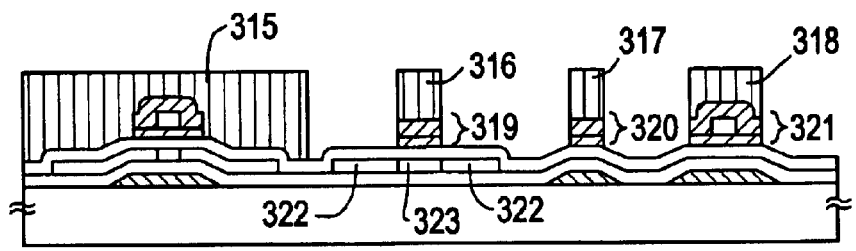

After the resist mask 32 is removed, second conductive layers 36 and 37 are formed. Through this step, a main gate wiring line of NTFT 38 is formed. (FIG. 12B)

Resist masks 315 to 318 are formed, and then the boron doping step is conducted. The doping condition may be referred to the step of FIG. 3C in Embodiment 1. Thus, after the phosphorus doping step and the boron doping step are conducted, the impurity element doped in the same way as Embodiment 1 is activated to obtain the result of FIG. 12C.

After the resist masks 315 to 318 are removed, the back side exposure method is used to form resist masks 324 to 327, and the phosphorus doping step is then conducted under the same doping conditions as the step of FIG. 3D in Embodiment 1.

Figure 12D:
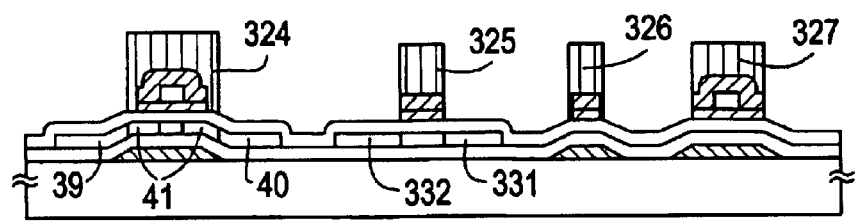

Through this step, a source region 39, a drain region 40 and the low concentration impurity region (the LDD region) 41 of the NTFT are formed, (FIG. 12D)

In this step, the length of the portion where the gate electrode 38 overlaps the LDD region 41 is set to 0.1 to 3.5 μm (typically 0.1 to 0.5 μm, preferably 0.1 to 0.3 μm) whereas the length of the portion where the gate electrode 38 does not overlap it is set to 0.5 to 3.5 μm (typically 1.5 to 2.5 μm).

And through the same step as Embodiment 1, a CMOS circuit with such a structure as shown in FIG. 11A is completed by forming a first interlayer insulating layer 108, source wiring lines 109 and 110 and a drain wiring line 111.

The description in this embodiment takes as a case of the manufacturing step of a CMOS circuit, but in the case of a pixel matrix circuit the structure of FIG. 11B may be obtained through the similar manufacturing step. Therefore, the description here is omitted.

The structure of this embodiment can also be applied to the AM-LCD of Embodiment 3 and can be freely combined with the structure shown in Embodiments 4 to 6.

Embodiment 8

In the step of FIG. 3D in Embodiment 1, it is effective that after the back side exposure method is used to form resist masks 324 to 327, a second insulating layer 306 is etched to remove and the exposed active layer is doped phosphorus.

This method lowers the acceleration voltage in doping phosphorus to 100 keV, and the burden of the doping device is lightened. The throughput is greatly improved. This is in the same way as the step shown in FIG. 4D in Embodiment 2.

The structure of this embodiment can also be applied to the AM-LCD of Embodiment 3 and can be freely combined with the structure shown in Embodiments 4 to 7.

Embodiment 9

This embodiment gives a description on the structure for reducing OFF current of NTFT in a CMOS circuit used in a driver circuit.

Figure 13:
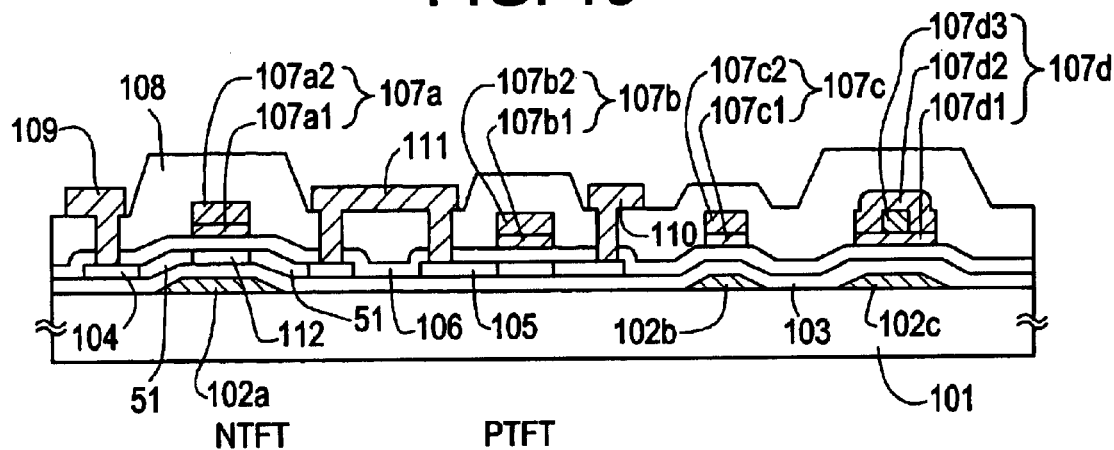
[FIG. 13] shows a structure of a CMOS circuit.

In FIG. 13, the LDD region 51 can be substantially divided into two portions, which one overlaps and another does not overlap a first wiring line 102a. Therefore, in adding a gate voltage to the first wiring line 102a, the structure of the NTFT of FIG. 13 has the LDD region not overlapped by a gate electrode outside of the LDD region overlapped by a gate electrode.

As described in Embodiment 8, this structure has an effect that degradation of ON current, which is the advantage of the GOLD structure, is prevented, and obtains electrical characteristics that increase of OFF current, which is the defect of the GOLD structure, is controlled. Accordingly, a CMOS circuit with very high reliability can be realized.

Here, an example of a CMOS circuit is described but the structure of this embodiment may be applied to a pixel matrix circuit.

To realize the structure of this embodiment, the back side exposure method may not be used in the step shown in FIG. 3D in Embodiment 1. That is, the structure of this embodiment can be obtained by doping phosphorus after providing the wider resist masks than the first wiring line by usual mask alignment.

The length of the LDD region (the length of portions that overlapped and not overlapped by a gate electrode) may be referred to the range shown in Embodiment 8.

The structure of this embodiment can also be applied to the AM-LCD of Embodiment 3 and can be freely combined with the structure shown in Embodiments 4 to 7.

Embodiment 10

This embodiment describes a case in which other methods than thermal crystallization is used to form the active layer shown in Embodiment 1 or 2

Specifically, a case is described in which the crystalline semiconductor film to use as an active layer is formed by the thermal crystallization method using the catalytic element. In the case used the catalytic element, it is desirable to use the technique disclosed in Japanese Patent Application Laid-open No. Hei 7-130652 (corresponding to U.S. patent application Ser. No. 08/329,644 or U.S. patent application Ser. No. 08/430,623) and Japanese Patent Application Laid-open No. Hei 8-78329. Specially, it is preferable to use nickel as the catalytic element.

The structure of this embodiment can be combined freely with all of the structures of Embodiments 1 through 9.

Embodiment 11

This embodiment describes a case, as a method of forming an active layer, in which the thermal crystallization method shown in Embodiment 10 is used and the catalytic element used in crystallization is removed from the crystalline semiconductor film. To remove the catalytic element, this embodiment employs a technique disclosed in Japanese Patent Application Laid-open No. Hei 10-135468 (corresponding to U.S. patent application Ser. No. 08/951, 193) or Japanese Patent Application Laid-open No. Hei 10-135469 (corresponding to U.S. patent application Ser. No. 08/951,819).

The technique described in the publication is to remove a catalytic element used in crystallization of an amorphous semiconductor film by utilizing gettering effect of halogen after crystallization. With this technique, the concentration of the catalytic element in the crystalline semiconductor film can be reduced to $1\times10^{17}$ atoms/cm$^3$ or less, preferably to $1\times10^{16}$ atoms/cm$^3$.

The structure of this embodiment can be combined freely with all of the structures of Embodiments 1 through 10.

Embodiment 12

This embodiment describes a case, as a method of forming an active layer, in which the thermal crystallization method shown in Embodiment 10 is used and the catalytic element used in crystallization is removed from the crystalline semiconductor film. To remove the catalytic element, this embodiment employs a technique disclosed in Japanese Patent Application Laid-open No. Hei 10-270363 (corresponding to U.S. patent application Ser. No. 09/050, 182).

The technique described in the publication is to remove a catalytic element used in crystallization by utilizing the gettering effect of phosphorus after crystallization. With this technique, the concentration of the catalytic element in the crystalline semiconductor film can be reduced to $1\times10^{17}$ atoms/cm$^3$ or less, preferably to $1\times10^{16}$ atoms/cm$^3$.

The structure of this embodiment can be combined freely with all of the structures of Embodiments 1 through 10.

Embodiment 13

This embodiment describes another mode of the gettering step by phosphorus which is shown in Embodiment 12. The basis of the step matches FIG. 1 and hence differences are picked out and explained.

Figure 14A:
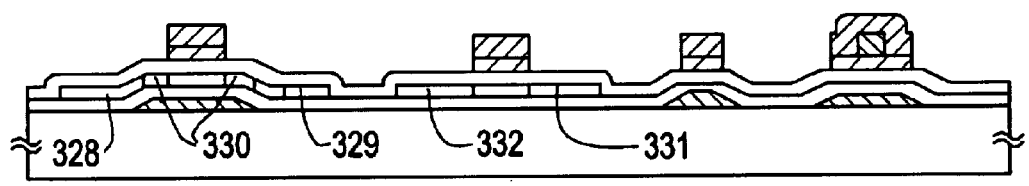
[FIG. 14] shows a process of manufacturing a CMOS circuit.

First, the state of FIG. 3D is obtained by following the process of Embodiment 1. FIG. 14A shows a state in which the resist masks 324 to 327 are removed from the state of FIG. 3D. A semiconductor layer to be an active layer of TFT is formed by using a technique of the thermal crystallization shown in Embodiment 10.

At this point, the source region 328 of the NTFT and the drain region 329 thereof, and the drain region 331 of the PTFT and the source region 332 thereof contain phosphorus in a concentration of $1\times10^{19}$ to $1\times10^{21}$ atoms/cm$^3$ (preferably $5\times10^{20}$ atoms/cm$^3$).

In this state, a heat treatment step is conducted in a nitrogen atmosphere at 500 to 800° C. for 1 to 24 hours, for example, at 600° C. for 12 hours, in this embodiment. Through the step, the impurity elements given n type and p type and used in doping are activated. Also, the catalytic element (nickel in this embodiment) remained after the crystallization step moves in the direction of the arrow and is gettered (trapped) in the source regions and drain regions mentioned above owing to the action of phosphorus contained in the regions. As a result, the nickel concentration in the channel formation region can be reduced to $1\times10^{17}$ atoms/cm$^3$ or less.

Figure 14B:
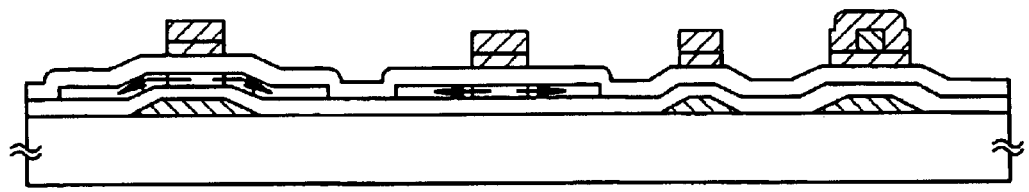

Once the step of FIG. 14B is completed, subsequent steps are conducted in accordance with the steps of Embodiment 1 to complete the CMOS circuit shown in FIG. 3E. Needless to say, similar steps are taken in the pixel matrix circuit.

The structure of this embodiment can be combined freely with all of the structures of Embodiments 1 through 10.

Embodiment 14

The TFT structure of the present invention can be applied not only to electro-optical devices such as AM-LCDs but to semiconductor circuits of every kind. It may be applied to microprocessors such as RISC processors and ASIC processors, to signal processing circuits such as D/A converters, and to high frequency circuits for portable equipment (cellular phones including PHS, and mobile computers).

It is possible to obtain a semiconductor device having a three-dimensional structure in which an interlayer insulating film is formed on a conventional MOSFET and the present invention is applied thereto to form a semiconductor circuit. The present invention thus is applicable to all of the semiconductor devices that currently employ LSIs. The present invention may be applied to the SOI structure (a TFT structure using a single crystal semiconductor thin film) such as SIMOX, Smart-Cut (trade name of SOITEC), and ELTRAN (trade name of Canon, Inc.).

The semiconductor circuits of this embodiment can be obtained by any structure resulting from combinations of Embodiments 1, 2 and 4 through 13.

Embodiment 15

A CMOS circuit and pixel matrix circuit formed by carrying out the present invention can be applied to various electro-optical devices and semiconductor circuits. That is, the present invention is applicable to all of electronic equipment that incorporates those electro-optical devices and semiconductor circuits as components.

Given as such electronic equipment are video cameras, digital cameras, projectors, projection TVs, head mounted displays (goggle type displays), automobile navigation systems, personal computers, portable information terminals (mobile computers, cellular phones, electronic books or the like), etc. Examples of those are shown in FIG. 15.

Figure 15A:
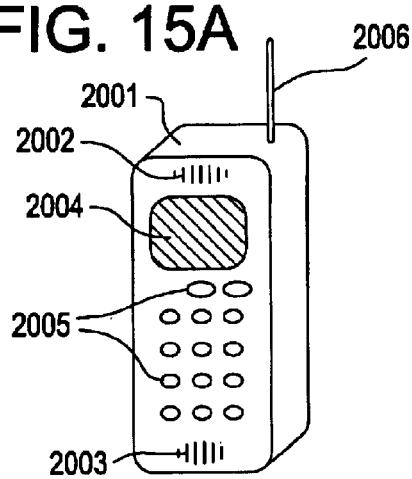
[FIG. 15] shows an example of an electric device.

FIG. 15A shows a cellular phone, which is composed of a main body 2001, an audio output unit 2002, an audio input unit 2003, a display device 2004, operation switches 2005, and an antenna 2006. The present invention is applicable to the audio output unit 2002, the audio input unit 2003, the display device 2004, and other signal controlling circuits.

Figure 15B:
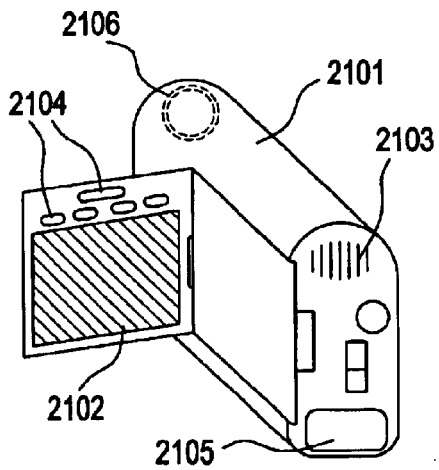

FIG. 15B shows a video camera, which is composed of a main body 2101, a display device 2102, an audio input unit 2103, operation switches 2104, a battery 2105, and an image receiving unit 2106. The present invention is applicable to the display device 2102, the audio input unit 2103, and other signal controlling circuits.

Figure 15C:
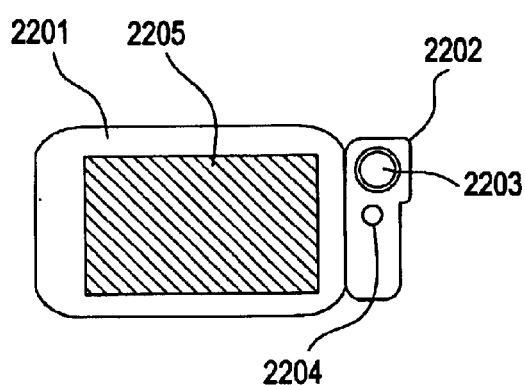

FIG. 15C shows a mobile computer, which is composed of a main body 2201, a camera unit 2202, an image receiving unit 2203, operation switches 2204, and a display devise 2205. The present invention is applicable to the display device 2205 and other signal controlling circuits.

Figure 15D:
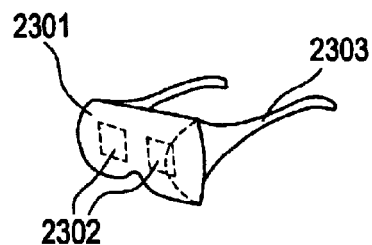

FIG. 15D shows a goggle type display, which is composed of a main body 2301, display devices 2302, and arm units 2303. The present invention is applicable to the display devices 2302 and other signal controlling circuits.

Figure 15E:
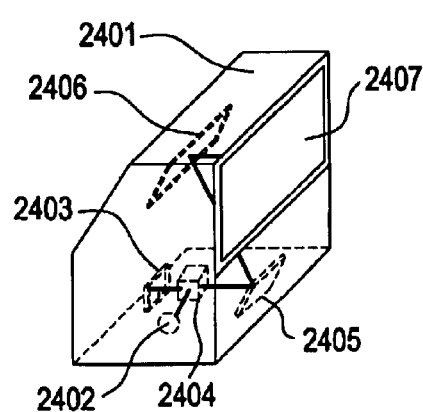

FIG. 15E shows a rear projector, which is composed of a main body 2401, a light source 2402, a display device 2403, a polarization beam splitter 2404, reflectors 2405 and 2406, and a screen 2407. The present invention is applicable to the display device 2403 and other signal controlling circuits.

Figure 15F:
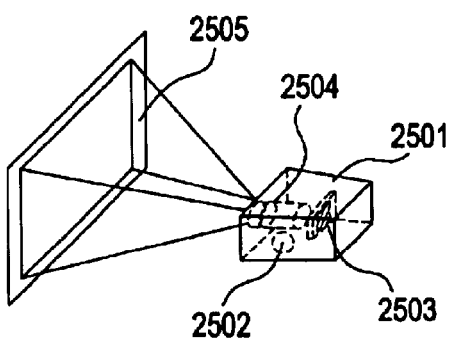

FIG. 15F shows a front projector, which is composed of a main body 2501, a light source 2502, a display device 2503, an optical system 2504, and a screen 2505. The present invention is applicable to the display device 2502 and other signal controlling circuits.

As described above, the application range of the present invention is so wide that it is applicable to electronic equipment of every field. The electronic equipment of this embodiment can be obtained by any structure resulting from combinations of Embodiments 1 through 14.

The present invention is characterized in that the same NTFT can form both the GOLD structure and the LDD structure and which one is to form is determined by controlling the voltage of a first wiring line provided under an active layer. In other words, the GOLD structure and the LDD structure can be formed on the same substrate without increasing the number of steps or complicating the process.

Therefore circuits having optimal functions can be arranged in accordance with the respective specifications required for the circuits, thus greatly improving the performance and reliability of a semiconductor device such as an AM-LCD and electronic equipment that has the AM-LCD as a display.

What is claimed is:

1. A semiconductor device including a CMOS circuit formed by an n-channel TFT and a p-channel TFT,
    wherein an active layer of the n-channel TFT is sandwiched by a first wiring line and a second wiring line through insulating layers,
    wherein the active layer includes a low concentration impurity region that is in contact with a channel formation region;
    wherein the low concentration impurity region is formed to overlap the first wiring line and not to overlap the second wiring line; and
    wherein the first wiring line is electrically connected with the second wiring line.

2. A semiconductor device including a CMOS circuit formed by an n-channel TFT and a p-channel TFT,
    wherein an active layer of the n-channel TFT is sandwiched by a first wiring line and a second wiring line through insulating layers; and
    wherein the second wiring line has a portion being a laminate of a first conductive layer and a second conductive layer, and a portion being a laminate of the first conductive layer, the second conductive layer and a third conductive layer.

3. The semiconductor device according to claim 2, wherein the third conductive layer has a lower resistance value than the first conductive layer and the second conductive layer.

4. The semiconductor device according to claim 2, wherein at least one of the first wiring line and the second wiring line contains an element selected from the group consisting of tantalum (Ta), titanium (Ti), tungsten (W), molybdenum (Mo), and silicon (Si).

5. The semiconductor device according to claim 2, wherein the third conductive layer mainly contains one of aluminum (Al) and copper (Cu).

6. A semiconductor device having a pixel matrix circuit that includes a pixel TFT and a storage capacitor formed by an n-channel TFT,
    wherein the pixel TFT has a structure that an active layer is sandwiched by a first wiring line and a second wiring line through insulating layers,
    wherein the active layer includes a low concentration impurity region that is in contact with a channel formation region;
    wherein the low concentration impurity region is formed to overlap the first wiring line and not to overlap the second wiring line; and
    wherein the second wiring lines has a portion being a laminate of a first conductive layer and a second conductive layer, and a portion being a laminate of the first conductive layer, the second conductive layer and a third conductive layer.

7. The semiconductor device according to claim 6, wherein the first wiring line is kept at one of a ground electric potential and a source power supply electric potential.

8. The semiconductor device according to claim 6, wherein the first wiring line is kept at a floating electric potential.

9. A semiconductor device having a pixel matrix circuit that includes a pixel TFT and a storage capacitor formed by an n-channel TFT,
    wherein the pixel TFT has a structure that an active layer is sandwiched by a first wiring line and a second wiring line through insulating layers, and
    wherein the second wiring line has a portion being a laminate of a first conductive layer and a second conductive layer, and a portion being a laminate of the first conductive layer, the second conductive layer and a third conductive layer.

10. The semiconductor device according to claim 9, wherein the third conductive layer has a lower resistance value than the first conductive layer and the second conductive layer.

11. The semiconductor device according to claim 9, wherein at least one of the first wiring line and the second wiring line contains an element selected from the group consisting of tantalum (Ta), titanium (Ti), tungsten (W), molybdenum (Mo), and silicon (Si).

12. The semiconductor device according to claim 9, wherein the third conductive layer mainly contains one of aluminum (Al) and copper (Cu).

13. A semiconductor device having a pixel matrix circuit and a driver circuit that are formed on a same substrate,
    wherein each of a pixel TFT included in the pixel matrix circuit and an n-channel TFT included in the driver circuit has a structure including an active layer sandwiched by each of a first wiring line and a second wiring line through insulating layers;
    wherein each of the active layers includes a low concentration impurity region that is in contact with each of channel formation regions;
    wherein each of the low concentration impurity regions is formed to overlap each of the first wiring lines and not to overlap each of the second wiring lines;
    wherein at least one of the second wiring lines has a portion being a laminate of a first conductive layer and a second conductive layer, and a portion being a laminate of the first conductive layer, the second conductive layer and a third conductive layer; and
    wherein the first wiring line of the pixel TFT is kept at one of a fixed electric potential and a floating electric potential, and the first wiring line of the n-channel TFT included in the driver circuit is kept at the same level of electric potential as the second wiring line of the n-channel TFT included in the driver circuit.

14. The semiconductor device according to claim 13, wherein at least one of the first wiring line and the second wiring line contains an element selected from the group consisting of tantalum (Ta), titanium (Ti), tungsten (W), molybdenum (Mo), and silicon (Si).

15. The semiconductor device according to any one of claims 1 to 13 and 14, wherein the semiconductor device is one of an active matrix liquid crystal display and an active matrix EL display.

16. The semiconductor device according to any one of claims 1 to 13 and 14, wherein the semiconductor device is one selected from the group consisting of a video camera, a digital camera, a projector, a projection TV, a goggle type display, an automobile navigation system, a personal computer, and a portable information terminal.

17. A semiconductor device having a pixel matrix circuit and a driver circuit that are formed on a same substrate,
   wherein each of a pixel TFT included in the pixel matrix circuit and an n-channel TFT included in the driver circuit has a structure including an active layer sandwiched by each of a first wiring line and a second wiring line through insulating layers;
   wherein each of the active layers includes a low concentration impurity region that is in contact with each of channel formation regions;
   wherein each of the low concentration impurity regions is formed to overlap each of the first wiring lines and not to overlap each of the second wiring lines; and
   wherein the first wiring line in the driver circuit is electrically connected with the second wiring line in the driver circuit.

18. The semiconductor device according to claim 17, wherein the semiconductor device is one of an active matrix liquid crystal display and an active matrix EL display.

19. The semiconductor device according to claim 17, wherein the semiconductor device is one selected from the group consisting of a video camera, a digital camera, a projector, a projection TV, a goggle type display, an automobile navigation system, a personal computer, and a portable information terminal.

20. A semiconductor device having a pixel matrix circuit and a driver circuit that are formed on a same substrate,
   wherein each of a pixel TFT included in the pixel matrix circuit and an n-channel TFT included in the driver circuit has a structure including an active layer sandwiched by each of a first wiring line and a second wiring line through insulating layers;
   wherein at least one of the second wiring lines has a portion being a laminate of a first conductive layer and a second conductive layer, and a portion being a laminate of the first conductive layer, the second conductive layer and a third conductive layer, and
   wherein the first wiring line of the pixel TFT is kept at one of a fixed electric potential and a floating electric potential, and the first wiring line of the n-channel TFT included in the driver circuit is kept at the same level of electric potential as the second wiring line of the n-channel TFT included in the driver circuit.

21. The semiconductor device according to claim 20, wherein the third conductive layer has a lower resistance value than the first conductive layer and the second conductive layer.

22. The semiconductor device according to claim 20, wherein at least one of the first wiring line and the second wiring line contains an element selected from the group consisting of tantalum (Ta), titanium (Ti), tungsten (W), molybdenum (Mo), and silicon (Si).

23. The semiconductor device according to claim 20, wherein the third conductive layer mainly contains one of aluminum (Al) and copper (Cu).

24. The semiconductor device according to claim 20, wherein the semiconductor device is one of an active matrix liquid crystal display and an active matrix EL display.

25. The semiconductor device according to claim 20, wherein the semiconductor device is one selected from the group consisting of a video camera, a digital camera, a projector, a projection TV, a goggle type display, an automobile navigation system, a personal computer, and a portable information terminal.

26. The semiconductor device according to claim 1, wherein at least one of the first wiring line and the second wiring line contains an element selected from the group consisting of tantalum (Ta), titanium (Ti), tungsten (W), molybdenum (Mo), and silicon (Si).

27. The semiconductor device according to claim 2, wherein the first wiring line is electrically connected with the second wiring line.

28. The semiconductor device according to claim 6, wherein at least one of the first wiring line and the second wiring line contains an element selected from the group consisting of tantalum (Ta), titanium (Ti), tungsten (W), molybdenum (Mo), and silicon (Si).

29. The semiconductor device according to claim 9, wherein the first wiring line is kept at one of a ground electric potential and a source power supply electric potential.

30. The semiconductor device according to claim 9, wherein the first wiring line is kept at a floating electric potential.

31. The semiconductor device according to claim 13, wherein the first wiring line of the n-channel TFT is electrically connected with the second wiring line of the n-channel TFT.

32. The semiconductor device according to claim 13, wherein the third conductive layer has a lower resistance value than the first conductive layer and the second conductive layer.

33. The semiconductor device according to claim 13, wherein the third conductive layer mainly contains one of aluminum (Al) and copper (Cu).

34. The semiconductor device according to claim 17, wherein at least one of the each of the first wiring line and the second wiring line contains an element selected from the group consisting of tantalum (Ta), titanium (Ti), tungsten (W), molybdenum (Mo), and silicon (Si).

35. The semiconductor device according to claim 20, wherein the first wiring line of the n-channel TFT is electrically connected with the second wiring line of the n-channel TFT.

* * * * *